United States Patent [19]
Tani et al.

[11] Patent Number: 6,093,338
[45] Date of Patent: *Jul. 25, 2000

[54] CRYSTAL-ORIENTED CERAMICS, PIEZOELECTRIC CERAMICS USING THE SAME, AND METHODS FOR PRODUCING THE SAME

[75] Inventors: Toshihiko Tani; Tsuguto Takeuchi; Yasuyoshi Saito, all of Aichi, Japan

[73] Assignee: Kabushiki Kaisha Toyota Chuo Kenkyusho, Aichi-gun, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/136,420

[22] Filed: Aug. 20, 1998

[30] Foreign Application Priority Data

Aug. 21, 1997 [JP] Japan ..................... 9-242113

[51] Int. Cl.$^7$ ............. H01L 41/187; C04B 35/622; C04B 35/475; C04B 35/491; C04B 35/495
[52] U.S. Cl. .............. 252/62.9 R; 252/62.9 PZ; 501/134; 501/135; 501/137; 501/12 C; 428/697; 264/437; 264/667
[58] Field of Search ............. 252/62.9 R, 62.9 PZ; 501/134, 135, 137, 126; 428/697; 264/437, 667

[56] References Cited

U.S. PATENT DOCUMENTS

| | | | |
|---|---|---|---|
| 5,155,558 | 10/1992 | Inam et al. | 361/321 |
| 5,248,564 | 9/1993 | Ramesh | 428/688 |
| 5,270,294 | 12/1993 | Wu et al. | 505/1 |

FOREIGN PATENT DOCUMENTS

| | | |
|---|---|---|
| 0 048 536 | 3/1982 | European Pat. Off. . |
| 48536 | 3/1982 | European Pat. Off. . |
| 0 296 477 | 12/1988 | European Pat. Off. . |
| 826643 | 3/1998 | European Pat. Off. . |
| 4-60073 | 9/1992 | Japan . |
| 9-100156 | 4/1997 | Japan . |

OTHER PUBLICATIONS

Derwent Abstract, AN 81–29640D, JP 56–021810, Feb. 28, 1981.
Derwent Abstract, AN 83–01049K, JP 88024950, May 23, 1988.
Derwent Abstract, AN 83–01048K, JP 88024949, May 23, 1988.
Derwent Abstract, AN 82–64354E, JP 88043340, Aug. 30, 1988.
Derwent Abstract, AN 82–66865E, JP 88043341, Aug. 30, 1988.
Hidenori Watanabe, et al., J. Am. Ceram. Soc., vol., 72, No. 2, pp. 289 to 293, "Particle Orientation During Tape Casting in the Fabrication of Grain–Oriented Bismuth Titanate", 1989.
Seung–Eek Park, et al., J. Appl. Phys., vol. 82, No. 4, pp. 1804 to 1811, "Ultrahigh Strain and Piezoelectric Behavior in Relaxor Based Ferroelectric Single Crystals", Aug. 15, 1997.

*Primary Examiner*—C. Melissa Koslow
*Attorney, Agent, or Firm*—Oblon, Spivak, McClelland, Maier & Neustadt, P.C.

[57] ABSTRACT

A crystal-oriented ceramic has an isotropic or pseudoisotropic perovskite-type-structure of not smaller than 10% in Lotgering orientation degree. The ceramic may contain at least one of Bi, Sr and Ca. A host material, a raw material capable of producing a guest material and an additive having the ability of converting a host material into a guest material are mixed and roll-pressed, and sintered under heat to give the crystal-oriented ceramic as a large-sized and bulky material. This crystal-oriented ceramic has good crystal orientation-dependent characteristics including piezoelectricity, pyroelectricity, ionic conductivity, giant magneto-resistivity effect, etc. This crystal-oriented ceramic can be produced by orienting epitaxially the polycrystals of an isotropic or pseudoisotropic perovskite oxide according to the orientation of the crystal plane or axis of a host material. The ceramic can be applied to an inexpensive and large-sized device. The host material may be a magnetoplumbite-type-structured or $Sr_2Nb_2O_7$-type-structured material, and may be composed of morphologically-anisotropic grains.

17 Claims, 16 Drawing Sheets

5 μm 1.00 μm

Sr2Nb2O7-type structure perovskite-like layer a common view of (110) plane of perovskite-type structure, and (010) plane of Sr2Nb2O7-type structure perovskite-type structure ⊕ oxygen octahedral block

CRYSTAL-ORIENTED CERAMICS, PIEZOELECTRIC CERAMICS USING THE SAME, AND METHODS FOR PRODUCING THE SAME

This application claims the priority of Japanese Patent Application No. 9-242113 filed Aug. 21, 1997, which is incorporated herein by reference.

BACKGROUND OF THE INVENTION

1. Field of the Invention

The present invention relates to crystal-oriented ceramics which comprise an oxide having an isotropic perovskite-type structure, and to methods for producing them.

The terminology, isotropic perovskite-type structure as referred to herein means a crystal structure which is generally referred to as a perovskite-type structure but specifically has a cubic system or a slightly-distorted cubic (pseudo-cubic) system. In that meaning, the terminology, isotropic perovskite-type structure substantially contains both isotropic and pseudoisotropic perovskite structure. This isotropic perovskite-type structure herein referred to shall be definitely differentiated from a layered perovskite-type structure.

2. Description of the Related Art

Some proposals have heretofore been made for the technique of orienting the crystal planes or the crystal axes of polycrystalline ceramics. By orienting specific crystal planes or axes of polycrystalline ceramics, their characteristics that depend on the specific crystal planes or axes can be significantly improved. Through such orientation, therefore, it is possible to obtain polycrystalline ceramics having characteristics similar to those of single crystals.

Especially for ferroelectric polycrystalline ceramics, of which the characteristics greatly depend on their crystal axes having polarity, if the crystals constituting them are oriented, their characteristics based on the polarity, such as the amount of remnant polarization, are said to be improved over those of non-oriented polycrystalline ceramics in which the crystals constituting them are not oriented. Various patent applications and technical reports for such crystal-oriented polycrystalline ceramics have heretofore been made.

For magnetic materials, it is reported that magnetic heads comprising crystal-oriented ferrite ceramics have improved in abrasion resistance and therefore their life times are prolonged (see Powders and Powder Metallurgy, Vol. 26, No. 4, pp. 123–130, 1979).

Various means and methods of orienting polycrystalline ceramics have heretofore been disclosed, some of which are referred to hereinunder.

For example, when a polycrystalline ceramic having a layered perovskite-type structure such as typically bismuth titanate ($Bi_4Ti_3O_{12}$), of which the surface energy at a specific crystal plane is much smaller than that at the other crystal planes, is hot-forged under uniaxial pressure with heating, it is converted into a dense, crystal-oriented ceramic in which the crystals constituting it are uniaxially oriented (see Jpn. J. Appl. Phys., Vol. 19, No. 1, pp. 31–39, 1980). This technique is to orient a substance having high crystal anisotropy in a stress field.

Substances having high crystal anisotropy, such as bismuth titanate mentioned above, can be produced in the form of powders of plate-like or needle-like grains. A method is known in which the powders having such morphological anisotropy are tape-cast in strips or extruded along with binders or liquids whereby they are oriented, and thereafter the shaped articles are sintered through heat treatment to obtain crystal-oriented ceramic articles (see J. Am. Ceram. Soc., Vol. 72, No. 2, pp. 289–293, 1989).

In the preprint of ISAF '96, page 211 (1996), blade-like grains of $Sr_2Nb_2O_7$ and fine grains of $Sr_2Nb_2O_7$ were mixed in such a ratio that the blade-like grains accounted for from 5 to 15% by volume, and sintered while orienting the blade-like grains to obtain sintered, crystal-oriented articles of $Sr_2Nb_2O_7$.

In the preprint of ISAF '96, page 223 (1996), plate-like grains of $Bi_4Ti_3O_{12}$ and fine grains of $Bi_4Ti_3O_{12}$ were mixed in such a ratio that the plate-like grains accounted for from 5 to 15% by volume, and tape-cast into a sheet while orienting the plate-like grains, and the resulting strips cut out of the sheet, are laminated and sintered at from 900 to 1000° C. to obtain sintered, crystal-oriented laminates of $Bi_4Ti_3O_{12}$.

The technique common to these two reports are herein referred as TGG (templated grain growth).

In J. Am. Ceram. Soc., 78 [6], 1687–1690 (1995), Hirao et al. disclosed a method for obtaining sintered, crystal-oriented laminates, which comprises mixing $\beta$-$Si_3N_4$ grains (seeds), which are rod-like single crystals, and fine grains of $\alpha$-$Si_3N_4$ along with sintering aids, tape-casting the resulting mixture into a sheet through a doctor-blading device, and laminating the resulting strips cut out of the sheet.

The above-mentioned techniques are all to orient materials having morphological anisotropy in a stress field.

$MO \cdot 6Fe_2O_3$ (where M denotes an element such as Ba, Sr, Pb or the like) having a magnetoplumbite-type structure is known as a typical hard ferrite, and is produced in various methods, such as solid phase or liquid phase methods, etc. (see J. J. Went, et al., Philips Tech. Rev. 13, 194 (1952); H. Yamamoto & R. Takeuchi, Powders and Powder Metallurgy, 43 (8), 984–989 (1996); Japanese Patent Application Laid-Open No. 56-50200).

This material has an axis of easy magnetization in its c-axial direction, and therefore the orientation of the material can be controlled by shaping or sintering the material in magnetic field. Through such controlled orientation, this material can be formed into a sintered, crystal-oriented body, of which the degree of c-axis orientation is, when measured according to X-ray diffractometry (in Lotgering method), more than 90% (see H. Taguchi, Electroceramics, July, 49–55 (1991); T. Shimoda, Electroceramics, July, 16–22 (1991)). In this case, since the large grains being oriented in the sintering step grow, while absorbing fine grains that are poorly orientable, it is known that the degree of orientation of the material increases with the growth of the large grains.

The crystal grains of such a material having a magnetoplumbite-type structure grow easily in the a-axial direction. Therefore, when the material is produced in a liquid phase method or the like, it is easy to obtain hexagonal plate-like grains of the material with morphological anisotropy having an expanded c-plane. In addition, it is possible to orient the grains of the material through compression molding, doctor blading or extrusion, in which are obtained sintered, crystal-oriented bodies with c-axial orientation (see Japanese Patent Application Laid-Open No. 55-154110). This technique is to orient the material with magnetic anisotropy and morphological anisotropy in a magnetic or stress field.

The above-mentioned techniques are to obtain oriented sintered bulks through the mechanism that comprises previously orienting a material with morphological anisotropy or magnetic anisotropy in a stress or magnetic field, followed by heating to thereby grow the oriented grains under heat. In this mechanism, the fine and poorly-orientable grains that exist along with the easily-orientable grains are not oriented and are absorbed by the oriented grains, while the oriented grains grow under heat.

However, these techniques are to attain the homoepitaxial growth of grains in a solid phase, and are therefore problematic in that they are applicable to the orientation of only materials with morphological or magnetic anisotropy to give crystal-oriented bulks of the materials.

It was possible to produce crystal-oriented ceramics such as spinel-type-structured ferrite according to so-called topotaxy, in which a powder mixture containing periodic-bond-chain-forming plate-like grains of, for example, α-type iron oxide, is shaped with increasing the degree of crystal orientation of the grains constituting the shaped product, whereupon the grains, and after the reaction upon heating, the reaction product, for example, ferrite inherit their orientation axes from the starting grains (see Electronic Ceramics, '91, July, pp. 56–63, 1991).

This technique is problematic in that it is effective only in the combination of the starting material that satisfies the steric lattice conformity applicable to topotaxy and the product from the starting material, for example, the combination of the starting material, iron oxide and the ceramic product, ferrite.

Apart from this, however, it was difficult to produce crystal-oriented ceramics having isotropic crystal forms of a cubic system or having pseudo-isotropic crystal forms of a slightly-distorted cubic system, if not starting from anisotropic materials with three-dimensional lattice conformity applicable to topotaxy. To produce such crystal-oriented ceramics, therefore, an expensive technique of growing single crystals was inevitable, and the producibility in this technique was poor.

Many ferroelectrics that are important in various engineering fields, such as typically PZT (compound name: lead zirconium titanate) and barium titanate, have a crystal form of a perovskite-type structure, which is a cubic structure or a slightly-distorted cubic structure, and their anisotropic characteristics greatly depend on the distorted direction.

However, the crystallographic anisotropy of these substances is very small, and it is therefore extremely difficult to produce powders with morphological anisotropy from these. In addition, the periodic-bond-chain-forming oxides of Ti, Zr, Nb or the like in these are similar to the periodic-bond-chain-forming oxides in perovskite-type-structured substances in terms of the long-range structure unit, and powders of these substances with morphological anisotropy cannot be produced. Therefore, it was difficult to control the orientation of these substances through topotaxy (see K. Kugimiya & K. Hirota, Electroceramics, July, pp. 56–63 (1991)).

Patent publications were issued which relate to a technique of producing oriented ceramics of lead titanate or barium titanate from potassium titanate fibers or their derivatives, fibrous titanium oxide and fibrous titanium oxide hydrate (see Japanese Patent Publication Nos. 63-24949, 63-24950, 63-43339, 63-43340, 63-43341). In principle, however, it is extremely difficult to produce crystal-oriented ceramics from potassium titanate fibers and their derivatives having a Ti—O bond network that is different from the network of a perovskite-type structure. This is because, even if grains of potassium titanate fibers and their derivatives could be oriented, the reaction to produce perovskite-type-structured compounds from them shall inevitably involve the re-arrangement of the Ti—O bond skeleton, and it is extremely difficult to still maintain the crystal orientation during the re-arrangement.

Another method of obtaining crystal-oriented ceramics having a crystal-oriented, perovskite-type structure comprises forming a thin film on a substrate through sputtering, chemical vapor deposition (CVD), sol-gel deposition or the like. To this, applicable is a known technique of epitaxy that shall occur between the specific crystal plane in the perovskite-type structure and the surface of the substrate having good lattice conformity with the specific crystal plane, or of self-texture that brings about the orientation of the specific crystal plane irrespective of the crystal orientation of the substrate but owing to the difference in the surface energy or the difference in the supply of elements.

However, this method is problematic in that it takes much time to produce thicker films, resulting in the increase in the production costs. In this method, in addition, the film to be formed is restrained by the substrate. Therefore, if a thicker film is formed in this method, it is often cracked or peeled from the substrate during heat treatment, due to the stress resulting from the crystallization and densification of the film or due to the difference in the degree of thermal expansion between the film and the substrate. If so, the film formed is broken.

For these reasons, it is extremely difficult to obtain crystal-oriented ceramic films having a thickness of larger than 5 $\mu$m, according to this method.

Therefore, this method is unsuitable for the production of bulky materials. As has been mentioned hereinabove, it was difficult to produce crystal-oriented ceramics having a perovskite-type structure, except for the expensive technique of growing single crystals with poor producibility.

It is reported, for example, perovskite-type single crystals with a rhombohedral morphotropic phase exhibited excellent piezoelectric properties when poled in the <111> direction as expressed in the form of a pseudo-cubic system (see Journal of Applied Physics, Vol. 82 No. 4, pp. 1804–11, 1997). However, the production of such single crystals were expensive technique and the small sizes of the obtained single crystals limited their applications.

The alignment of crystal axes could also enhance the piezoelectric properties of the lead-free and thus environmentally benign piezoelectric ceramics in the perovskite-type structure. $Bi_{0.5}Na_{0.5}TiO_3$ and its solid solutions are known as promising candidates for lead-free or -less-containing piezoelectrics since they have relatively high electromechanical coupling factor and good sinterability, as reported in several documents (Japanese Examined Patent Publication No. 4-60073; Silicates Industries, No. 7/8, 136–142, 1993; Sensors and Materials, Vol. 9, No. 1, 47–55, 1997). However, the $Bi_{0.5}Na_{0.5}TiO_3$ and its solid solutions without crystal orientation gives relatively smaller planar electromechanical coupling coefficients (Kp) and transverse piezoelectric properties ($d_{31}$ and $g_{31}$) Known are crystal-oriented ceramics, in which a plurality of crystal planes or axes are oriented in three-dimensional orientation.

Crystal-oriented ceramics of that type can be produced by hot-pressing ceramic grains with morphological anisotropy in different directions. Japanese Patent Publication No. 01-32186 discloses the production of sintered bodies with three-dimensional orientation directly from grains with morphological anisotropy.

Japanese patent applications were laid open, which relate to the production of spinel-type-structured magnetic ceramics with three-dimensional orientation by extruding flaky or needle-like grains and in which the grains are three-dimensionally oriented through topotaxy (see Japanese Patent Application Laid-Open Nos. 49-129892, 56-21810, 56-27902).

However, according to the above-mentioned techniques, it was impossible to produce crystal-oriented ceramic bulks having isotropic crystal forms of a cubic system or having pseudo-isotropic crystal forms of a slightly-distorted cubic system, if not starting from anisotropic materials with three-dimensional lattice conformity applicable to topotaxy. To produce such crystal-oriented ceramic bulks, an expensive technique of growing single crystals was inevitable, and the producibility in this technique was poor.

For producing devices with excellent characteristics by orienting the crystal axis of a functional thin film comprising an isotropic perovskite-type compound, such as PZT (zirconium lead titanate), or a functional thin film comprising a layered perovskite-type compound such as a high-temperature superconductor, it is known to form the functional thin film on a single-crystalline substrate, for example, MgO, $Al_2O_3$, or an isotropic perovskite-type compound, such as $SrTiO_3$, which has epitaxial relation to the compound of the film being formed.

In particular, it is especially preferred to use a substrate comprising single crystals of $SrTiO_3$ or the like isotropic perovskite-type compound having good lattice conformity to the substance of the thin film to be formed on the substrate. In this preferred case, obtained are thin films with better crystallinity and orientation.

According to the above-mentioned method, it is possible to form a functional thin film comprising the above-mentioned compound, directly on the above-mentioned single-crystalline substrate. If desired, electrodes or other devices may be formed on the single-crystalline substrate, and a functional thin film comprising the above-mentioned compound may be formed thereover.

Where electrodes are formed on the single-crystalline substrate, an electroconductive thin film of a metal such as Pt, or of an electroconductive perovskite-type compound such as $LaNiO_3$, which has epitaxial relation to the substrate, is formed on the substrate, and thereafter a functional thin film comprising the above-mentioned compound is formed over the electroconductive thin film through sol-gel deposition, sputtering, laser ablation or the like. In this process, the functional thin film formed is epitaxially oriented relative to the single-crystalline substrate.

One example is disclosed in J. Appl. Phys., 60 [1], 361–367 (1986), in which is formed a thin oriented film of $PbTiO_3$ on a substrate of epi{100}Pt/{100}MgO single crystals.

Jpn. J. Appl. Phys., 16, 1707–1708 (1977) discloses the formation of a thin, epitaxially-oriented film of (Pb,La)(Zr, Ti)$O_3$ on a substrate comprising single crystals of $SrTiO_3$.

Japanese Patent Application Laid-Open Nos. 6-310769 and 7-309700 disclose the formation of a thin, high-temperature superconductive film comprising a layered perovskite-type compound on a substrate comprising single crystals of $SrTiO_3$. In addition, it is known to form a thin ferroelectric film having an isotropic perovskite-type structure over the high-temperature superconductive thin film, while using the high-temperature superconductive thin film as an electrode that acts also as a template.

Appl. Phys. Lett., 69 [22], 3432–3434 (1996) discloses a device as produced by forming a thin film of isotropic perovskite-type-structured $Nd_{0.7}Sr_{0.3}MnO_3$ having a giant magneto-resistivity effect on a substrate of single crystals of $LaAlO_3$, followed by further forming a thin film of isotropic perovskite-type-structured $YBa_2Cu_3O_7$ thereover.

As the single-crystalline substrate, mostly used are isotropic perovskite-type-structured substrates. This is because isotropic perovskite-type-structured or layered perovskite-type-structured oxide-type single-crystalline substrates are usable as templates for uniaxial orientation and epitaxial growth of most thin, isotropic perovskite-type-structured, functional films.

However, isotropic perovskite-type-structured oxide single-crystalline substrates are expensive, and large-area wafers are difficult to form thereon. Therefore, even if various thin films are formed on such expensive single-crystalline substrates, it is difficult to obtain low-priced devices. In addition, if large-area devices (having an area of 100 mm$^2$ or larger) are formed on such single-crystalline substrates, the yield of the devices is low.

In addition, commercially-available, oxide-type single-crystalline substrates are limited. For example, for isotropic perovskite-type compounds, only $SrTiO_3$, $LaAlO_3$ and the like are commercially available. Given this situation, it is difficult to obtain single-crystalline substrates having good lattice conformity with functional thin films to be epitaxially grown on the substrates. If the lattice conformity of the single-crystalline substrate with the functional thin film formed thereon is poor, the degree of orientation of the functional thin film formed is low, resulting in that the property of the device formed is unfavorable.

SUMMARY OF THE INVENTION

In consideration of the above-mentioned problems, one object of the present invention is to provide crystal-oriented ceramics, which have excellent, crystal orientation-dependent characteristics. The crystal-oriented ceramics can be produced easily and inexpensively in thick bulks. Another object is to provide methods for producing such crystal-oriented ceramics. Still another object is to provide crystal-oriented ceramic substrates, on which can be formed functional thin films with a high degree of orientation. The crystal-oriented ceramic substrates, even having a large area, can be produced easily and inexpensively. Yet another object is to provide devices comprising such crystal-oriented ceramic substrates.

The first aspect of the present invention is to provide a crystal-oriented ceramic comprising an isotropic perovskite-type-structured oxide and having a degree of crystal orientation of not smaller than 10% as measured according to the Lotgering method.

An isotropic perovskite-type-structured oxide is oriented to give the crystal-oriented ceramic of the first aspect of the invention, of which the characteristics that depend on the crystal orientation of the thus-oriented oxide are much more improved than those of ordinary polycrystalline ceramics.

This improvement can be attained when the degree of crystal orientation is not smaller than 10%, but is much more remarkable when the degree of crystal orientation is higher. Preferably, the degree of crystal orientation to be measured according to the Lotgering method is not smaller than 30%.

As the characteristics of the crystal-oriented ceramic of the invention, referred to are at least one or more of its piezoelectricity, pyroelectricity, thermoelectricity, ionic conductivity, electronic conductivity, magnetism, giant magneto-resistivity effect, and electro-optic effect. Based on its various characteristics such as those mentioned above, the crystal-oriented ceramic of the present invention is usable as a functional ceramic material having many applications, for example, in at least one or more of sensors such as acceleration sensors, pyroelectric sensors, ultrasonic sensors, magnetic sensors, electric-field sensors, temperature sensors, gas sensors, etc.; energy conversion devices such as thermoelectric converters, piezoelectric transformers, etc.; as well as piezoelectric actuators, ultrasonic motors, resonators, capacitors, ionic conductors, electronic conductors, photo-switches, polarizers, etc.

The Lotgering method is referred to hereinunder.

The degree of crystal orientation, Q(HKL), of the crystal-oriented ceramic to be measured according to the Lotgering method is defined by the following equation (1)

$$Q(HKL)=[\{\Sigma'I(HKL)/\Sigma I(hkl)-\Sigma'I_0(HKL)/\Sigma I_0(hkl)\}/\{1-\Sigma'I_0(HKL)/\Sigma I_0(hkl)\}] \times 100(\%) \qquad (1)$$

In this equation (1), I(HKL) indicates the intensity of the X-ray diffraction from the specific, oriented crystal plane (HKL) in the crystal-oriented ceramic; and $I_0$(HKL) indicates the intensity of the X-ray diffraction from the specific crystal plane (HKL) in a non-oriented polycrystalline ceramic, which is the same compound having the same composition as the crystal-oriented ceramic.

$\Sigma'I$(HKL) indicates the sum of the intensities of the X-ray diffraction from crystal-oriented planes, such as I(100), I(200), I(300), etc., in the crystal-oriented ceramic; and $\Sigma I_0$(hkl) indicates the sum of the intensities of the X-ray diffraction from all the crystal planes (hkl) in the non-oriented polycrystalline ceramic.

Q(HKL) is so regulated that it is 0% in random orientation, and that it is 100% in complete orientation of all crystal grains.

If the crystal-oriented ceramic of the present invention has a degree of crystal orientation of smaller than 10%, it could not produce the advantages of the invention.

In general, isotropic perovskite-type-structured compounds can be represented by a chemical formula of $(ABO_3)_n$, in which A and B each represent an atom or an atomic group composed of one or more metal elements.

The second aspect of the present invention is such that at least a part of the oxide in the crystal-oriented ceramic is oriented relative to the {100} plane of the perovskite-type structure as expressed in the form of a pseudo-cubic system. Of the oriented ceramic of that type, the characteristics that depend on the crystal orientation of the perovskite-type oxide are much more improved than those of ordinary polycrystalline ceramics. The oriented ceramic of this second aspect of the invention is usable as a substrate for forming thereon a thin film as oriented relative to the {100} plane of a perovskite-type structure when expressed in the form of a pseudo-cubic system, or a thin film as oriented relative to the {001} plane of a layered perovskite-type structure when expressed in the form of a pseudo-tetragonal system, through epitaxial growth of the film thereon.

Though its details will follow hereinafter, the material of the crystal-oriented ceramic comprising the above-mentioned oxide is not specifically defined but may be any compound having a perovskite-type structure.

It is desirable that the degree of orientation relative to the {100} plane of the isotropic perovskite-type-structured oxide in the crystal-oriented ceramic of the invention is not smaller than 10% when measured according to the Lotgering method.

The crystal orientation-dependent characteristics of the crystal-oriented ceramic of the invention comprising the thus-oriented oxide of that type are good. Based on its good crystal orientation-dependent characteristics, the crystal-oriented ceramic of the invention can be used as a functional ceramic material.

It is more desirable that the degree of Lotgering orientation of the oxide is not smaller than 30%.

In the crystal-oriented ceramic of this aspect, at least a part of the isotropic perovskite-type-structured oxide is oriented relative to the {100} plane of the perovskite-type structure.

Accordingly, the crystal orientation-dependent characteristics of the crystal-oriented ceramic of this aspect are remarkable. Therefore, although the ceramic is polycrystalline, its characteristics are rather similar to those of single crystals, being different from those of ordinary polycrystalline ceramics.

As the crystal orientation-dependent characteristics of the ceramic of this aspect, referred to are at least one or more of its piezoelectricity, pyroelectricity, thermoelectricity, ionic conductivity, electronic conductivity, magnetism, and giant magneto-resistivity effect.

The pseudo-cubic system as referred to herein indicates crystal lattices of a slightly-distorted cubic system. A lot of substances not having a true cubic system shall fall within the scope of an isotropic perovskite-type structure. All of such substances are herein considered to be similar to the substances of a true cubic system, and referred to as pseudo-cubic substances. Crystal axes and planes of the pseudo-cubic substances are herein expressed in the same way as in the cubic system.

The third aspect of the present invention is such that the oxide in the crystal-oriented ceramic contains at least one element of Bi, Sr and Ca. In this aspect, A in the above-mentioned chemical formula is at least one element of Bi, Sr and Ca.

More preferably, A in the formula comprises from 2 to 50 mol % of Bi. Accordingly, preferred are compositions of $(Bi_{0.2}A'_{0.98})BO_3$ to $(Bi_{0.5}A'_{0.5})BO_3$, where A' means the remainder of A from which Bi has been removed.

The ceramic of the third aspect of the invention has good piezoelectricity and pyroelectricity.

The bismuth-containing oxide includes, for example, $Bi_{0.5}Na_{0.5}TiO_3$, $Bi_{0.5}K_{0.5}TiO_3$, $Bi_{0.5}(Na,K)_{0.5}TiO_3$, $(Pb,Bi)(Fe,Ti)O_3$, $Pb_{0.5}Bi_{0.5}Ni_{0.25}Ti_{0.75}O_3$, $(Bi,Pb)(Zr,Ti)O_3$, $(Bi,Pb)(Zr,Ti,Nb)O_3$, $(Bi,Pb)(Zr,Ti,Fe)O_3$, and $(Bi,Pb)(Zr,Ti,Mn)O_3$.

However, these are not limitative. In principle, all Bi-containing, perovskite-type-structured oxide materials and even their solid solutions are employable in the present invention.

Crystal-oriented ceramics of compounds of the above-mentioned chemical formula where A is at least one element of Sr and Ca have good piezoelectricity, pyroelectricity and dielectricity. In particular, they are useful as piezoelectric materials in microwave applications.

The oxide comprising at least one element of Bi, Sr and Ca is oriented to give the crystal-oriented ceramic of this aspect of the invention, of which the characteristics that depend on the crystal orientation of the thus-oriented oxide comprising at least one element of Bi, Sr and Ca are much more improved than those of ordinary polycrystalline ceramics.

As the characteristics of the crystal-oriented ceramic, referred to are at least one or more of its piezoelectricity, pyroelectricity, thermoelectricity, ionic conductivity, electronic conductivity, magnetism, giant magneto-resistivity effect, and electro-optic effect. Based on its various characteristics such as those mentioned above, the crystal-oriented ceramic of this aspect of the invention is usable as a functional ceramic material having many applications, for example, in at least one or more of sensors such as acceleration sensors, pyroelectric sensors, ultrasonic sensors, magnetic sensors, electric-field sensors, temperature sensors, gas sensors, etc.; energy conversion devices such as thermoelectric converters, piezoelectric transformers, etc.; as well as piezoelectric actuators, ultrasonic motors, resonators, capacitors, ionic conductors, electronic conductors, photo-switches, polarizers, etc.

The crystal orientation-dependent characteristics of the crystal-oriented ceramic of this aspect of the invention are all good.

The fourth aspect of the invention is such that at least a part of the oxide of the crystal-oriented ceramic contains rhombohedral morphotropic phase with piezoelectricity, and has a degree of crystal orientation of not smaller than 30% as measures according to the Lotgering method relative to the {100} plane of the perovskite-type structure as expressed in the form of a pseudo-cubic system. Such crystal-oriented ceramic exhibited excellent piezoelectric properties when compared with randomly oriented polycrystalline ceramic with the same composition. The perovskite-type ceramics with a rhombohedral morphotropic phase include solid solutions with $Bi_{0.5}Na_{0.5}TiO_3$ and the other solid solutions such as $(Pb,Bi)(Ni,Ti)O_3$, $Ba(Zr,Ti)O_3$, $(Ba,K)(Ti,Nb)O_3$ with the composition of a rhombohedral morphotropic phase.

The fifth aspect of the invention is such that the oxide is a solid solution containing $Bi_{0.5}Na_{0.5}TiO_3$ as one of components. Such crystal-oriented ceramic is lead-free or -less-containing and exhibits excellent piezoelectric properties when compared with randomly oriented polycrystalline ceramic with the same composition. The other component to form a solid solution with $Bi_{0.5}Na_{0.5}TiO_3$ is, for example, $Bi_{0.5}K_{0.5}TiO_3$, $BaTiO_3$, $PbTiO_3$, $SrTiO_3$, $CaTiO_3$, $NaNbO_3$, and $KNbO_3$. The composition of these preferable oxides is expressed as, $x(ABO_3)+(1-x)(Bi_{0.5}Na_{0.5}TiO_3)$, where $ABO_3$ and x are chosen from the combinations of the composition and value written below.

| $ABO_3$ | range of x value |
|---|---|
| $Bi_{0.5}K_{0.5}TiO_3$ | $0 \leq x < 0.25$ |
| $BaTiO_3$ | $0 \leq x < 0.1$ |
| $PbTiO_3$ | $0 \leq x < 0.2$ |
| $SrTiO_3$ | $0 \leq x < 0.25$ |
| $CaTiO_3$ | $0 \leq x < 0.1$ |
| $NaNbO_3$ | $0 \leq x < 0.1$ |
| $KNbO_3$ | $0 \leq x < 0.1$ |

The perovskite-type solid solution ceramics with the composition mentioned above are $Bi_{0.5}Na_{0.5}TiO_3$-related solid solutions containing a rhombohedral morphotropic phase. The piezoelectric ceramics with the compositions are readily densified by a usual sintering process and are lead-free or -less-containing ceramics with good piezoelectric properties such as planar electromechanical coupling coefficients (Kp) and transverse piezoelectric properties ($d_{31}$ and $g_{31}$).

The above-mentioned x value corresponds to the molar ratio of $ABO_3$. For example, when $ABO_3$ is "$Bi_{0.5}K_{0.5}TiO_3$" and the range of x value is "$0 \leq x<0.25$", the composition of the preferable oxide is $Bi_{0.5}K_{0.5X}Na_{0.5}(1-X)TiO_3$, where x is in the range of $0 \leq x<0.25$. This is a solid solution of $Bi_{0.5}Na_{0.5}TiO_3$ and $Bi_{0.5}K_{0.5}TiO_3$.

The piezoelectric ceramic of the present invention is not necessarily limited to a solid solution of $Bi_{0.5}Na_{0.5}TiO_3$ and one of $ABO_3$. A solid solution of $Bi_{0.5}Na_{0.5}TiO_3$ and at least two of $ABO_3$ is also effective as long as the solid solution contains a rhombohedral morphotropic phase.

The sixth aspect of the invention is such that at least a part of the oxide of the crystal-oriented ceramic is oriented relative to the {110} plane of the perovskite-type structure as expressed in the form of a pseudo-cubic system.

Though its details will follow hereinafter, the oxide is not specifically defined but may be any compound having a perovskite-type structure. It is desirable that the degree of {110} orientation of the isotropic perovskite-type-structured oxide in the crystal-oriented ceramic is not smaller than 10% when measured according to the Lotgering method.

The crystal orientation-dependent characteristics of the crystal-oriented ceramic comprising the thus-oriented oxide of that type are good. Based on its good crystal orientation-dependent characteristics, the crystal-oriented ceramic of the invention can be used as a functional ceramic material.

It is more desirable that the degree of Lotgering orientation of the oxide is not smaller than 30%.

In the crystal-oriented ceramic of this aspect, at least a part of the isotropic perovskite-type-structured oxide is oriented relative to the {110} plane of the perovskite-type structure, as in FIG. 11 to be referred to hereinunder.

Accordingly, the crystal orientation-dependent characteristics of the crystal-oriented ceramic of this aspect are remarkable. Therefore, although the ceramic is polycrystalline, its characteristics are rather similar to those of single crystals, being different from those of ordinary polycrystalline ceramics.

As the crystal orientation-dependent characteristics of the ceramic of this aspect, referred to are its piezoelectricity, pyroelectricity, thermoelectricity, ionic conductivity, electro-optic effect, and polarizing effect.

It is desirable that at least a part of the guest material is three-dimensionally oriented.

As being in this condition, the crystal-oriented ceramic of this aspect can be cut out at any desired specific crystal plane, like single crystals. Accordingly, the ceramic of that type can be formed into devices or substrates having any desired effective crystal plane of, for example, {100}, {111}, {110} or the like.

The wording "three-dimensional crystal orientation" as referred to herein means that the guest material is oriented not only relative to the {110} plane of the perovskite-type structure but also relative to the plane that is vertical to the {110} plane, for example, relative to the {001} plane of the structure, as in FIG. 8B. Accordingly, the crystal-oriented ceramic of this aspect is a biaxially-oriented ceramic.

In the biaxially-oriented ceramic of this aspect, it is desirable that the degree of Lotgering orientation of each plane is not smaller than 10%. More preferably, the degree of Lotgering orientation is not smaller than 30%.

The seventh aspect of the present invention is such that at least a part of the oxide in the crystal-oriented ceramic is oriented relative to the {111} plane of the perovskite-type structure as expressed in the form of a pseudo-cubic system.

The crystal orientation-dependent characteristics of the ceramic of that type are improved. Based on its improved, crystal orientation-dependent characteristics, the crystal-oriented ceramic of the invention can be used as a functional ceramic material.

Specifically, the crystal orientation-dependent characteristics of the crystal-oriented ceramic of this aspect are remarkable. Therefore, although the ceramic is polycrystalline, its characteristics are rather similar to those of single crystals, being different from those of ordinary polycrystalline ceramics.

As the crystal orientation-dependent characteristics of the ceramic of this aspect, referred to are its piezoelectricity, pyroelectricity, thermoelectricity, ionic conductivity, magnetism, etc.

Now, the eighth aspect of the present invention is directed to a method for producing a crystal-oriented ceramic comprising:

forming at least a part of the isotropic perovskite-type-structured guest material on the surface and/or in the inside of seed crystals of a host material having morphological anisotropy, from a raw material capable of forming a guest material having an isotropic perovskite-type structure; and orienting at least a part of the crystal plane or axis of the isotropic perovskite-type-structured guest material in accordance with the orientation of the crystal plane or axis of the host material.

In the production method of this aspect, the raw material of the guest material is, after having been applied to the seed crystals of the host material, converted into the intended guest material on the surface of the host material. In this step, the guest material epitaxially grows around the crystal lattice of the host material that acts as a template for the epitaxial growth.

The epitaxial growth occurs for the following reasons.

When the crystals of the guest material grow on the surface of the host material, those of the former having lattice conformity with the crystal lattice existing in the surface of the host material are more stable than the others thereof not having it. In other words, the crystals of the guest material having the lattice conformity have smaller surface energy than the others thereof not having it, and therefore the former is energetically more favorable than the latter.

Accordingly, the guest material is crystallized to give oriented crystals, while following the orientation of the crystals of the host material, irrespective of whether the crystals themselves of the guest material are easily orientable or hardly orientable.

All or a part of the crystals of the guest material will grow epitaxially. If a part of the crystals grow epitaxially, some crystals of the guest material growing anywhere except the surface and/or the inside of the host material will not be oriented.

Since the guest material has an isotropic perovskite-type structure, the host material to be used herein must be such that at least one crystal plane of the host material has lattice conformity, or lattice matching with at least one crystal plane of the isotropic perovskite-type structure of the guest material.

Now, the host material is referred to hereinunder.

It is desirable that the host material is a particulate material having morphological anisotropy. For example, the material may be a powder of plate-like, blade-like, columnar, needle-like or flaky grains each having a large aspect ratio of minor axis/major axis.

Preferably, the host material has an aspect ratio of 5 or larger. Using the host material of that type, obtained is a crystal-oriented ceramic having a higher degree of crystal orientation. More preferably, the host material has an aspect ratio of 10 or larger.

The major axis of each grain of the host material is preferably 0.5 $\mu$m or larger.

The host material of that type can gain larger surface energy, thereby facilitating the growth of the crystals of the guest material on the surface of the host material.

In addition, using the host material of that type, the amount of the crystals of the guest material to grow thereon is increased.

More preferably, the major axis of each grain of the host material is 5 $\mu$m or larger.

The host material having such a large aspect ratio can be easily obtained, for example, by synthesizing a layered perovskite-type-structured substance having high crystal anisotropy in a liquid or gaseous phase. In order to obtain the host material having a larger aspect ratio, preferably employed is any of a flux method of producing it in a flux at a high temperature, a hydrothermal method, or a method of precipitating it in a super-saturated solution. These methods are mostly effective even when a minor amount of a liquid phase exists in the system of producing the host material.

As the host material, usable herein is any of metal oxides, metal hydroxides, metal salts, and free metals.

The host material must be such that the two-dimensional crystal lattice of at least one crystal plane of the material has lattice conformity with the two-dimensional crystal lattice of at least one crystal plane of the crystal of the guest material to grow.

One preferred embodiment of the host material, to which the guest material is applied in the invention, is such that the largest plane of the grain of the host material (for example, for columnar grains constituting a particulate host material, the crystal plane to give the side surface of the columnar grain is the largest one) has lattice conformity with at least one crystal plane of the crystal of the guest material to grow.

Precisely, in order that the crystal of the guest material epitaxially grows around the template of the crystal lattice of the host material, the two, the crystal of the host material and that of the guest material, must be such that the two-dimensional lattice of at least one crystal plane of the former has lattice conformity with that of the latter.

For this, if the two have the lattice conformity with each other at their respective largest crystal planes, the guest material can grow efficiently.

One example of the lattice conformity is referred to. When the host material is a metal oxide, at least one lattice point of oxygen or at lest one lattice point of the metal element in the crystal lattice of the host material is analogous to the corresponding lattice point in the two-dimensional crystal lattice of a certain crystal plane of the guest material.

The lattice conformity as referred to herein is represented by the value as obtained by dividing the difference in the lattice dimension at the analogous position between the host material and the guest material by the standardized lattice dimension of the host material. In the present invention, the value of the lattice conformity is preferably not larger than 20%.

In the combination of the host material and the guest material satisfying the defined lattice conformity, it is easy to realize a lowered value of interface energy therebetween, thereby facilitating the epitaxial growth of the guest material.

More preferably, the value of the lattice conformity is not larger than 10%.

The most preferred host material to be combined with a certain guest material has a chemical bond that is analogous to the strongest chemical bond in the crystal structure of the guest material.

In the combination of the most preferred host material and the guest material for it, the interface energy between a specific crystal plane of the host material and a specific crystal plane of the guest material is small, thereby bringing about easy epitaxial growth of the guest material.

Therefore, as the host material for producing an isotropic perovskite-type-structured ceramic as oriented relative to the {100} plane expressed in the form of a pseudo-cubic system, usable is a substance having a layered perovskite-type structure, tetragonal tungsten bronze-type structure or the like; as the host material for producing an isotropic perovskite-type-structured ceramic as oriented relative to the {110} plane expressed in the form of a pseudo-cubic system, usable is a substance having a structure of $Sr_2Nb_2O_7$ or the like; and as the host material for producing an isotropic perovskite-type-structured ceramic as oriented relative to the {111} plane expressed in the form of a pseudo-cubic system, usable is a substance having a layered rock salt-type structure, an wurtzite-type structure, a $Ba_5Ta_4O_{15}$-type structure, a magnetoplumbite-type structure, a corundum-type structure, an ilmenite-type structure, a hexagonal tungsten bronze-type structure or the like.

The isotropic perovskite-type-structured guest material to be derived from the raw material in this aspect includes, for example, dielectrics such as $SrTiO_3$, etc.; ferroelectrics such as $BaTiO_3$, $PbTiO_3$, $Pb(Zr,Ti)O_3$, $KNbO_3$, $Bi_{0.5}Na_{0.5}TiO_3$, $Bi_{0.5}K_{0.5}TiO_3$, $Pb_{0.5}Bi_{0.5}Ni_{0.25}Ti_{0.75}O_3$, etc.; antiferroelectrics such as $PbZrO_3$, $NaNbO_3$, etc.; mild ferroelectrics such as $PbMg_{1/3}Nb_{2/3}O_3$, $PbZn_{1/3}Nb_{2/3}O_3$, $(Pb,La)(Zr,Ti)O_3$, etc.; magnetic substances such as $(La,Ca)MnO_3$, etc.; and semiconductors such as $Ba_2LnIrO_6$ (Ln=La, Ce, Pr, Eu, Ho, Er, Yb, Lu), etc.

These materials represented by their chemical formulae are not limitative, but almost all isotropic perovskite-type-structured substances are usable in the production method of this aspect of the invention to give crystal-oriented ceramics. Solid solutions of these substances are also employable in the invention.

The raw material to give the guest material includes, for example, simple oxides, hydroxides, carbonates, nitrates, sulfates, salts of organic acids, alkoxides, etc., and any of those is usable in the invention.

For example, where the guest material is any of $BaTiO_3$, $PbTiO_3$, $Pb(Zr,Ti)O_3$, $Bi_{0.5}Na_{0.5}TiO_3$, $Bi_{0.5}(Na,K)_{0.5}TiO_3$ or the like, the host material to be combined therewith may be selected from oxides such as $TiO_2$, PbO, $ZrO_2$, $Bi_2O_3$, etc.; composite oxides such as $Na_2TiO_3$, $K_2TiO_3$, etc.; and carbonates such as $BaCO_3$, $Na_2CO_3$, $K_2CO_3$, etc.

In order to finally obtain a ceramic of a single phase of the guest material having an isotropic perovskite-type structure, some compositional limitations will be needed in the combination of the host material and the guest material to be used. For example, referred to is a combination of the guest material and the host material in which the elements constituting the former shall include those constituting the latter.

It is desirable that the volume of the host material is not smaller than 5% relative to 100% of the volume of the final product, crystal-oriented ceramic.

In this condition, the crystal plane or axis-dependent characteristics of the crystal-oriented ceramic can be improved to a significant degree for practical use.

In general, the raw materials of the guest material and the host material are mixed to give a mixture, then the host material in the resulting mixture is oriented, and thereafter the mixture is heated, whereby at least a part of the guest material is grown on the surface and/or in the inside of the host material, while at least a part of the crystal planes or axes of the guest material are oriented in accordance with the orientation of the crystal planes or axes of the host material.

For attaining the orientation, in general, the mixture is shaped in an orienting condition. This will be described in detail in the section of the orienting step to be referred to hereinafter. Besides using the raw material of the guest material, a powder of the guest material itself may be mixed with the host material.

Now, the ninth aspect of the invention is directed to a method for producing a crystal-oriented ceramic comprising:

orienting at least a part of the crystal plane or axis of a guest material having an isotropic perovskite-type structure in accordance with the orientation of the crystal plane or axis of seed crystals of a host material having morphological anisotropy.

In the production method of this aspect, the guest material which is finer than the host material is re-oriented in a different direction around the seed crystals of the oriented host material. In this step, precisely, the guest material is epitaxially oriented around the crystal lattice of the host material that acts as a template for the epitaxial growth.

The epitaxial orientation occurs for the following reasons.

When heated around the surface of the host material, the crystals of the guest material having lattice conformity with the crystal lattice existing in the surface of the host material are more stable than the others thereof not having it. In other words, the crystals of the guest material having the lattice conformity have smaller surface energy than the others thereof not having it, and therefore the former is energetically more favorable than the latter.

When compared with the eighth aspect mentioned hereinabove, in which is used a raw material of the guest material, this ninth aspect directly using the guest material itself is more advantageous than the eighth aspect in that sintered products having a higher density are easily obtained in the former than in the latter, but, on the other hand, the degree of orientation of the product obtained in the ninth aspect is often lower in some degree than that of the product obtained in the eighth aspect.

All or a part of the crystals of the guest material will be oriented epitaxially. If a part of the crystals are oriented epitaxially, some crystals of the guest material will not be oriented anywhere except the surface and/or the inside of the host material.

The same as in the eighth aspect shall apply to the selection of the host material in this ninth aspect.

Now, the tenth aspect of the present invention is directed to one embodiment of the sixth and ninth aspects relating to the production of the crystal-oriented ceramic of the invention. The embodiment of this tenth aspect comprises:

a mixing step of mixing the host material with the raw material capable of forming a guest material and/or the isotropic perovskite-type-structured guest material to give a mixture;

an orientation step of orienting the crystal plane or axis of the host material in the mixture; and a heating step of forming and orienting the guest material in accordance with the crystal plane or axis.

The mixing step is referred to hereinafter.

The host material may be dry-mixed with the other material, but is desirably wet-mixed therewith in water or in an organic solvent, using a ball mill or a stirrer.

Where a water-soluble host material such as $Na_2CO_3$ is used, the liquid component must be removed from the mixture under the condition under which the host material and the other material is hardly segregated. If this removal is effected through suction filtration or evaporation to dryness, it must be carried out speedily. Desirably is used a spray drier for the removal. However, if the mixture is oriented by wet-shaping it, for example, by doctor-blading it in the next orientation step, the slurry mixture may be directly processed without being dried.

In the mixing step, the host material may be mixed with the other material along with any ordinary additives, which include, for example, a dispersant, and also a binder, a plasticizer and the like that are necessary for the next orientation to be mentioned below.

The next orientation step is referred to hereinafter.

In the orientation step, the mixture prepared in the mixing step is oriented by any shaping means. It is desirable that the mixture is shaped into a shaped body in this orientation step.

The shaping means employable for the orientation includes, for example, wet or dry uniaxial die-pressing, extrusion, tape-casting such as doctor-blading, roll-pressing, centrifugal shaping, etc.

Of these, preferred are extrusion and roll-pressing to obtain shaped bodies having a high degree of orientation. A combination of the two is more preferred. The shaped bodies obtained according to doctor-blading, extrusion molding or the like shaping means may be laminated under pressure or roll-pressed to give crystal-oriented ceramics having a degree of orientation of 50% or higher. Depending on the means for the orientation shaping, obtained are crystal-oriented ceramics with uniaxial orientation or biaxial orientation.

It is desirable that the roll-pressing is effected to attain a reduction ratio in thickness of 10% or higher.

If roll-pressed in this condition, the crystal-oriented ceramics obtained will have a high degree of crystal orientation.

If, however, the draft is lower than 10%, the crystal-oriented ceramics obtained will have a low degree of crystal orientation. It is not always necessary to attain the desired draft in one roll-pressing operation. As the case may be, the roll-pressing may be repeated several times to attain the final draft of 10% or higher.

The draft as referred to herein is defined by (H0–H1)/H0, in which H0 indicates the thickness of the non-roll-pressed body, and Hi is the thickness of the roll-pressed body. For this, referred to is FIG. 5 attached hereto.

Where the mixture contains water or an organic solvent and the wet mixture is directly shaped, the shaped body is dried to remove water or the organic solvent therefrom prior to being heated in the next heating step.

The heating step is referred to hereinafter.

The shaped body obtained in the previous orientation step is heated, whereupon at least a part of the guest material is formed on the surface and/or in the inside of the seed crystal of the host material.

In this heating step, the heating temperature shall be higher than the temperature at which the guest material is produced from the raw material and which can be known through thermal analysis of the material. However, it is desirable that the heating temperature is as low as possible, and that the heating time is as short as possible.

In the above-mentioned condition, the epitaxial growth and/or the orientation of the guest material existing on the surface and/or in the inside of the host material can be predominantly effected.

In practice, the heating temperature varies, depending on the type of the guest material that shall constitute the intended product, crystal-oriented ceramic.

However, if the guest material is an ordinary oxide, the heating temperature preferably falls between 200° C. and 1200° C. for the reasons mentioned hereinabove. The ambient atmosphere in this heating step may be air or oxygen.

If the heating temperature is lower than 200° C., satisfactory epitaxial growth and/or orientation will be often difficult to attain. If, however, the heating temperature is higher than 1200° C., large grains of the non-oriented guest material will be formed.

However, if the heating step involves hydrothermal reaction or precipitation from solution, the heating temperature may be lower than the above-mentioned range. For example, though depending on the type of the guest material used, the heating may be effected at a low temperature falling between 20° C. and 250° C. In this case, however, the heating time must be not shorter than 10 minutes.

In this case, if the heating temperature is lower than 20° C., satisfactory epitaxial growth and/or orientation will be often difficult to attain. If, however, it is higher than 250° C., the surface and/or the inside of the host material will be corroded and roughened, often resulting in the failure in the intended epitaxial growth.

If the heating time is shorter than 10 minutes in this case, satisfactory epitaxial growth will be often difficult to attain.

The heating means to be employed in the heating step is not specifically defined. For example, employable are various furnaces, such as electric furnaces, gas furnaces, image furnaces, etc. Preferred are the means of using microwaves, millimeter waves or the like to predominantly heat the host material. Using the heating means of that type, the epitaxial growth of the guest material on the surface of the host material is effectively promoted.

It is preferable that the grains of the guest material formed are further grown in the latter half of the heating step.

In this grain-growth step, the non-oriented or randomly-oriented guest material as grown anywhere except the surface and/or the inside of the host material can be incorporated into the epitaxially-oriented guest material as the oriented guest material grows (Ostwald grain growth).

Accordingly, the degree of orientation of the final product, crystal-oriented ceramic can be increased after the grain-growing stage.

In general, it is preferable that the grain-growth step is effected within a temperature range for the sintering of the oriented ceramic to densify the guest material. In this condition, the orientation of the ceramic is improved simultaneously with the densification of the guest material.

Though depending on the type of the guest material, the temperature for the grain growth is, for example, preferably between 800° C. and 1600° C., which is higher than the temperature range for the epitaxial growth of the guest material.

If the temperature for the grain growth is lower than 800° C., the grain growth could not bring about satisfactory improvement in the orientation. If it is higher than 1600° C., some materials will be decomposed.

It is desirable that the time for the grain growth is 30 minutes or longer.

If the time is shorter than this, the grains could not be satisfactorily grown.

When the guest material is an oxide, the grain-growth step may be effected in air or oxygen. However, the step is preferably effected in an oxygen atmosphere, as favorably producing oriented ceramic products having a high density.

If desired, the grain-growth step may be effected under mechanical pressure or hot isostatic pressure (HIP), whereby the oriented ceramic may be further densified.

During the grain-growth step, some volatile components will evaporate or diffuse from the host material and the guest material in some degree, often resulting in that the composition and the crystal structure of the component which is thermodynamically more unstable (for example, for the combination of a layered perovskite-type substance and a perovskite-type substance, the former layered perovskite-type substance is thermodynamically more unstable than the latter) will be partly changed.

If the composition of the material as mixed with the host material is the same as the stoichiometric one that is necessary for producing the guest material from it, the guest material and also the host material optionally comprising a part of the composition of the guest material as diffused thereinto will remain in the sintered body as obtained after the heat treatment.

For example, where the host material is a layered perovskite-type compound and the guest material is a perovskite-type compound, both the layered perovskite-type compound and the perovskite-type compound remain in the sintered body as obtained after the heat treatment, while being oriented.

In this case, for example, bismuth titanate is used as the host material, a mixture comprised of $Bi_2O_3$, $Na_2CO_3$ and $TiO_2$ in a molar ratio of $Bi/Na/Ti=1/1/2$ is used as the raw material of the guest material, and the guest material to be produced from the raw material is bismuth sodium titanate.

In this embodiment, formed is a composite substance comprised of layered perovskite-type-structured bismuth titanate or layered-structured bismuth sodium titanate, $Bi_{4.5}Na_{0.5}Ti_4O_{15}$, as formed through the reaction of bismuth titanate and bismuth sodium titanate, and the guest material of perovskite-type-structured bismuth sodium titanate.

Now, the eleventh aspect of the present invention is directed to another embodiment of the production method of any of the sixth to tenth aspects of the invention. The embodiment of this eleventh aspect further comprises a conversion step of converting the host material into the guest material in the presence of an additive having the ability to convert the host material into the guest material.

In this aspect, the host material is reacted with the additive, whereby the host material is converted into the guest material or into at least one other guest material having an isotropic perovskite-type structure. In this case, therefore, produced is an oriented ceramic bulk of isotropic perovskite-type only. The oriented ceramic bulk obtained in this process is a functional ceramic having highly improved characteristics, and this process produces it inexpensively.

The additive may be added during or after the guest-producing and orienting steps.

Where the additive is added during the guest-producing and orienting steps, it may be added at the initial stage of the process of the invention, or may be added during the step of orienting the crystal plane or axis of the host material, or may be added during the step of producing and/or orienting the guest material. The additive may be added at any stage of the guest-producing and orienting steps.

In the present invention, the guest material epitaxially grows around the host material, depending on the latter, to give a mixture of these materials.

If the additive having the ability to convert the host material into the guest material acts in the mixture, the host material in the mixture is converted into the guest material through the reaction between the host material and the additive. Accordingly, after having been oriented, the host material is converted into the guest material through the reaction.

In this case, therefore, the host material does not almost remain in the product, crystal-oriented ceramic, and the product thus obtained is composed of only the guest material.

The additive is especially effective in the following cases.

The first case is that the raw material from which is obtained the guest material is prepared to have a composition that is the same as the stoichiometric composition of the guest material. In this case, for example, bismuth titanate is used as the host material, a mixture comprised of $Bi_2O_3$, $Na_2CO_3$ and $TiO_2$ in a molar ratio of $Bi/Na/Ti=1/1/2$ is used as the raw material of the guest material, and the guest material to be produced from the raw material is bismuth sodium titanate.

In this embodiment, formed is a composite substance comprised of layered perovskite-type-structured bismuth titanate or layered-structured bismuth sodium titanate, $Bi_{4.5}Na_{0.5}Ti_4O_{15}$, as formed through the reaction of bismuth titanate and bismuth sodium titanate, and the guest material of perovskite-type-structured bismuth sodium titanate.

In this, if an additive as prepared by mixing the same raw materials in the same mixing ratio as above, for example, a mixture of $Na_2CO_3$ and $TiO_2$ is added to the host material of bismuth titanate in a ratio of $Bi_4Ti_3O_{12}/Na_2CO_3/TiO_2=1/2/5$, the additive reacts with the host material of bismuth titanate to completely consume it, while giving the guest material of bismuth sodium titanate.

As a result of that reaction process, a crystal-oriented ceramic which is almost in a single phase is obtained in this case.

As is known from the above, the additive depends on the host material and the raw material of the guest material, and its examples are not specifically referred to herein. For example, the components constituting the raw material of the guest material can be used as the additive, as in Example 3 to be mentioned hereinunder.

The addition of the additive may often produce other guest materials which are different from the guest material existing in the system. In this case, the crystal-oriented ceramic obtained is in the form of a compositional mixture comprising different guest materials. This embodiment is applicable to the production of a crystal-oriented ceramic comprising solid solutions of two different substances.

Herein referred to is one example of producing two different guest materials, in which bismuth titanate is used as the host material, $Bi_2O_3$, $Na_2CO_3$ and $TiO_2$ are used as the raw material of the guest material, and $K_2CO_3$ and $TiO_2$ are used as the additive.

In the above-mentioned example, the host material disappeared as a result of the reaction with the additive. Accordingly, the crystal-oriented ceramic obtained in this example is $Bi_{0.5}(Na,K)_{0.5}TiO_3$, which is a solid solution of the two guest materials, $Bi_{0.5}Na_{0.5}TiO_3$ and $Bi_{0.5}K_{0.5}TiO_3$.

Now, the twelfth aspect of the present invention is directed to a method for producing a crystal-oriented ceramic comprising:

a step of preparing a host material having morphological anisotropy, a raw material capable of producing a guest material having an isotropic perovskite-type structure and/or an isotropic perovskite-type-structured guest material, and an additive having the ability to convert the host material into the guest material or into at least one other guest material having an isotropic perovskite-type structure;

an orientation step of mixing the host material, the raw material and/or the guest material, and the additive, and orienting the crystal plane or axis of the host material to obtain a primary oriented body; and a step of heating and sintering the primary oriented body to obtain an oxide having an isotropic perovskite-type structure.

In this aspect, it is desirable that the additive that acts to convert the host material into the guest material or into at least one other guest material having an isotropic perovskite-type structure is previously mixed with the host material and with the raw material and/or the guest material, prior to the orientation step. This is because this previous addition is preferred to the addition of the additive after the orientation step, since the additive added can be more uniformly mixed with the host material in the former than in the latter, and since the cost for the former is lower than that for the latter.

In this aspect, the host material is converted into the guest material or into any other guest material which has an isotropic perovskite-type structure like the originally-existing guest material but is different from the originally-existing guest material.

Since there exists the crystal conformity between the host material and the guest material produced from the raw material, there shall also exist the crystal conformity between the guest material produced from the raw material and the other guest material converted from the host material.

The step in which the guest material is produced from the raw material is not always definitely differentiated from the step in which the host material reacts with the additive to be converted into a different guest material with respect to the time or the temperature, and the two steps will partly overlap with each other.

Therefore, from the viewpoint of the guest material or its crystal structure that is in a single phase as a whole, the method of this aspect can produce a substance comprised of a single-phase guest material 1 and another guest material 2. When the guest material 1 is different from the guest material 2, the method of this aspect generally produces a solid solution having a perovskite-type structure in most cases.

In this aspect, the crystal orientation of the guest materials 1 and 2 or a solid solution of these shall follow the crystal orientation of the host material. Therefore, in this aspect, the intended crystal-oriented ceramic can be obtained with ease through host-orientation, for example, orientation shaping such as roll-pressing and sintering, irrespective of whether the crystals themselves of these guest materials are easily orientable or hardly orientable.

In addition, according to the production method of this aspect, it is easy to obtain a crystal-oriented ceramic composed of bulks of the guest materials or of the solid solution of the materials through various orientation shaping to give bulks.

Since the production method of this aspect does not require any specific apparatus, it gives the intended crystal-oriented ceramic easily and inexpensively.

As is known from the above, the twelfth aspect of the invention gives the intended crystal-oriented ceramic bulk easily and inexpensively.

For the details of the orientation step and the heating step in this twelfth aspect, referred to are those of the same steps in the tenth aspect mentioned hereinabove.

Now, the thirteenth aspect of the invention is directed to one embodiment of the production of a crystal-oriented ceramic according to the above-mentioned sixth to twelfth aspects. In this thirteenth aspect, the host material to be used is a particulate composite ceramic having, on at least one part of its surface, the isotropic perovskite-type-structured guest material epitaxially formed thereon in advance.

The host material of that type to be used in this aspect can be prepared by dispersing a powder of a substance having lattice conformity with the isotropic perovskite-type structured guest material, for example, a layered perovskite-type-structured material, in a solution capable of precipitating an isotropic perovskite-type-structured substance therein, whereby the intended isotropic perovskite-type-structured substance is precipitated on the surface of the powdery substance under heat or through pH change. For example, a powder of bismuth titanate is subjected to hydrothermal treatment in an aqueous solution containing Pb and Ti, whereby lead titanate is epitaxially formed around bismuth titanate while having lattice conformity therewith to give a particulate composite ceramic. The host material of that type can be oriented in the above-mentioned orientation shaping steps. In addition, if the particulate composite ceramic of the host material is prepared by forming an isotropic perovskite-type-structured material on the surface of a powdery, ferromagnetic magnetoplumbite-type-structured substance, it can also be oriented in a magnetic field, for example, in the manner to be mentioned hereinunder.

The fourteenth aspect of the present invention is directed to a method for producing a crystal-oriented ceramic comprising:

a step of preparing a host material having morphological anisotropy and an additive having the ability to convert the host material into a material having an isotropic perovskite-type structure;

an orientation step of mixing the host material and the additive, and orienting the crystal plane or axis of the host material to obtain a primary oriented body; and a step of heating and sintering the primary oriented body to obtain an oxide having an isotropic perovskite-type structure.

In this aspect, the heating step is to produce the isotropic perovskite-type-structured material through the reaction of the host material and the additive. Prior to the heating step, the crystal plane or axis of the host material is previously oriented in the orientation step. Therefore, the isotropic perovskite-type-structured material as produced in the heating step is also oriented at its crystal plane or axis.

For the details of the orientation step and the heating step in this fourteenth aspect, referred to are those of the same steps in the tenth aspect mentioned hereinabove.

Now, the fifteenth aspect of the invention is directed to one embodiment of the production of a crystal-oriented ceramic according to the above-mentioned sixth to fourteenth aspects. In this fifteenth aspect, the host material to be used has a layered perovskite-type structure.

Precisely, the method of the fifteenth aspect comprises a step of preparing a host material having a layered perovskite-type structure and having morphological anisotropy, a raw material capable of producing a guest material having an isotropic perovskite-type structure and/or an isotropic perovskite-type-structured guest material, and an additive that acts to convert the host material into the guest material or into at least one other guest material having an isotropic perovskite-type structure; a step of mixing the host material, the raw material and/or the guest material, and the additive, followed by orienting the materials to give a primary oriented body; and a step of heating and sintering the primary oriented body to obtain the guest material of an oxide having an isotropic perovskite-type structure.

In general, the strongest chemical bond in the isotropic perovskite-type structure is the bond chain composed of oxygen and the metal element, such as Ti, Zr, Sn, Nb, Mn, Fe, Sb, Mg, Zn or the like existing at the center of the oxygen octahedron in the structure. In this structure, the bond chain extends in three directions.

Accordingly, in this aspect, it is desirable that the host material to be used has a crystal plane analogous to the plane that includes two of the three directions in which the bond chain of the isotropic perovskite-type structure extends.

Concretely, when the isotropic perovskite-type structure is interpreted to have a pseudo-cubic system, the host material to be used desirably has a crystal plane analogous to the {100} plane of the isotropic perovskite-type structure.

Therefore, since the guest material to be used in this aspect has an isotropic perovskite-type structure, it is desirable that the host material to be used has a crystal plane in which two bond chains each composed alternately of oxygen and a metal element, such as Ti, Zr, Sn, Nb, Mn, Fe, Sb, Mg, Zn or the like, cross at right angles or nearly at right angles.

As one example of the metal oxides that satisfy the above-mentioned condition, referred to is a so-called layered perovskite-type-structured substance. Accordingly, the host material to be used in this aspect is preferably such a layered perovskite-type-structured substance.

This is because the layered perovskite-type structure has crystal anisotropy since its interlayer bond is relatively weak, and because it has metal element-oxygen bond chains that is common to both the layered perovskite-type structure and the isotropic perovskite-type structure.

Of such layered perovskite-type-structured substances, the most popular are so-called, layered bismuth compounds comprising a plurality of perovskite-type layers as sandwiched between $Bi_2O_2$ layers.

As specific examples of the layered bismuth compounds, mentioned are $Bi_4Ti_3O_{12}$ (bismuth titanate), $BiVO_{5.5}$, $Bi_2WO_6$, etc.

Generally referred to are substances to be represented by $(Bi_2O_2)^{2+}(A_{m-1}B_mO_{3m+1})^{2+}$, in which A indicates at least one mono- to tri-valent metal element, such as Na, Sr, Pb, Bi, rare earth elements, etc.; and B indicates at least one metal element such as Ti, Nb, Ta, etc.

Many compounds fall within the category of the above-mentioned substances, including, for example, $SrBi_2Nb_2O_9$, $SrBi_2Ta_2O_9$, $BaBi_2Nb_2O_9$, $BaBi_2Ta_2O_9$, $BaBi_3Ti_2NbO_{12}$, $PbBi_2Nb_2O_9$, $PbBi_2Ta_2O_9$, $SrBi_4Ti_4O_{15}$, $BaBi_4Ti_4O_{15}$, $PbBi_4Ti_4O_{15}$, $Sr_2Bi_4Ti_5O_{18}$, $Pb_2Bi_4Ti_5O_{18}$, etc.

In addition, a series of copper-containing, layered perovskite-type-structured compounds which are known as high-temperature superconductive materials also fall within the category.

Layered perovskite-type-structured substances not containing Bi are also usable as the host material in this aspect. For these, mentioned are so-called Ruddlesden-Popper-type compounds which include, for example, $Sr_2TiO_4$, $Sr_3Ti_2O_7$, $Sr_4Ti_3O_{10}$, $Ca_3Ti_2O_7$, $Ca_4Ti_3O_{10}$, $Sr_2RuO_4$, $(La,Sr)_2MnO_4$, $(La,Sr)_2CrO_4$, $K_2NiF_4$, etc.

The above-mentioned examples of the host material are especially preferred, since they can be produced with ease in the form of plate-like grains in a flux or solution.

Using the host material of that type, obtainable are crystal-oriented ceramics having a higher degree of crystal orientation.

For example, when bismuth oxide and titanium oxide, from which $Bi_4Ti_3O_{12}$ is produced, are heated in a molten salt, obtained is a powder of plate-like grains which can be used as the host material in the present invention. A mixture of bismuth oxide and titanium oxide, in which the amount of bismuth oxide is not smaller than the stoichiometric ratio relative to titanium oxide, may be heat-treated at a temperature not lower than the melting point of bismuth oxide to obtain the intended host material. Also to obtain it, an aqueous solution or sol comprising bismuth oxide and titanium oxide may be heated in an autoclave.

Now, the sixteenth aspect of the present invention is directed to the production of the crystal-oriented ceramic of the invention according to any of the above-mentioned sixth to fourteenth aspects. In the sixteenth aspect, the host material to be used has a structure of $Sr_2Nb_2O_7$. According to the method of the sixteenth aspect, obtained is the crystal-oriented ceramic of the sixth aspect of the invention, which is such that at least a part of the isotropic perovskite-type-structured oxide of the crystal-oriented ceramic is oriented relative to the {110} plane as expressed in the form of a pseudo-cubic system.

Precisely, the method of the sixteenth aspect comprises mixing a host material of $Sr_2Nb_2O_7$-type-structured grains with morphological anisotropy, of which the {010} plane is expanded, the guest material and/or the raw material of the guest material, and the additive to give a mixture, then shaping the resulting mixture to give a shaped body in which at least a part of the host material is oriented relative to the {010} plane of its crystal structure, and thereafter further treating the shaped body whereby at least a part of the guest material in the body is oriented relative to its crystal plane or axis.

The host material for use in this aspect is referred to hereinunder.

The host material is a $Sr_2Nb_2O_7$-type-structured compound and is composed of grains with morphological anisotropy, of which the {010} plane is expanded, as in FIG. 9.

The $Sr_2Nb_2O_7$-type structure is in the form of a laminate of perovskite-like layers, in which the {110}-like plane of the perovskite-like structure is expanded, the layers being laminated in the direction of the <010> axis of the $Sr_2Nb_2O_7$-type structure, as in FIG. 12A.

In the $Sr_2Nb_2O_7$-type structure, the bonding force at the boundary area of the perovskite-like layers is weak. Therefore, when produced in a gaseous phase, flux or solution, the grains shall be morphologically anisotropic while having the expanded {010} plane of the $Sr_2Nb_2O_7$-type structure, as in FIG. 9A.

Comparing the direction of the <100> axis and that of the <001> axis in the $Sr_2Nb_2O_7$-type structure, the bonding force toward the direction of the <100> axis is stronger than that toward the direction of the <001> axis. Therefore, it is also possible to produce blade-like $Sr_2Nb_2O_7$-type-structured grains with morphological anisotropy, of which the {010} plane is expanded and which is prolonged in the direction of the <100> axis, as in FIG. 9B.

It is desirable that the morphologically-anisotropic grains that constitute the host material each have an aspect ratio (thickness/major axis or minor axis) of not smaller than 3.

Using the host material of that type, it is easy to obtain an oriented body, in which the {010} plane of the host material is oriented, in the orientation shaping step which will be mentioned hereinunder.

The aspect ratio of the grain is more preferably 10 or larger. If so, the degree of orientation of the host material can be increased more.

It is also desirable that the morphologically-anisotropic grains constituting the host material are much larger than the grains of the guest material, as well as than those of the raw material of the guest material and even those of the additive. The grains of these materials and the additive will be referred to hereinunder.

In this aspect of using the host material of such a preferred type, where the shaped body comprising the oriented host material is heated, the guest material can be re-arranged or epitaxially grown to be in lattice matching with the crystal orientation of the morphologically-anisotropic grains constituting the host material on the surfaces and/or in the inside of the grains without interfering with the orientation of the host material.

In one example of this preferred embodiment, where the grains of the guest material, those of the raw material of the guest material and those of the additive have a grain size of 0.1 µm or so, it is desirable that the dimension of the expanded plane of each host grain is not smaller than 0.5 µm (in terms of its major axis).

In order to finally obtain a ceramic product of a single phase of the guest material having an isotropic perovskite-type structure, some compositional limitations will be needed in the combination of the host material and the guest material to be used. For example, referred to is a combination of the guest material and the host material in which the elements constituting the former shall include those constituting the latter.

One specific example of the combination comprises $Sr_2Nb_2O_7$ as the host material and $(Pb,Sr)(Ni,Nb)O_3$ (PSNN) or PSNN-PZT as the guest material.

Another example comprises $Ca_2Nb_2O_7$ as the host material and $(Pb,Ca)(Ni,Nb)O_3$ (PCNN) or PCNN-PZT as the guest material.

Still another example comprises $La_2Ti_2O_7$ as the host material and $(Pb,La)TiO_3$ (PLT) or $(Pb,La)(Zr,Ti)O_3$ (PLZT) as the guest material.

In this aspect, it is also desirable that the host material is in the form of blade-like grains with morphological anisotropy, that at least a part of the host material in the shaped body is biaxially oriented, and that at least a part of the guest material is three-dimensionally oriented in accordance with the orientation of the host material as a result of the heat treatment of the shaped body.

In this preferred condition, the crystal-oriented ceramic of this aspect can be cut out at any desired specific crystal plane, like single crystals. Accordingly, the ceramic of that type can be formed into devices or substrates having any desired effective crystal plane of, for example, {100}, {111}, {110} or the like.

It is still desirable that the host material is in the form of grains having morphological anisotropy and having a ratio of major axis/minor axis of not smaller than 3.

Using the host material of such a preferred type, it is easy to obtain a biaxially-oriented shaped body in which the host material is oriented relative to the {010} plane of the grains constituting it, and in addition, the direction of the major axis of the morphologically-anisotropic grains constituting the host material is unified.

More desirably, the morphologically-anisotropic grains of the host material have a ratio of major axis/minor axis of 10 or larger. Using the host material of this more preferred type, the shaped body may have a much higher degree of orientation.

The composition of the host material is not specifically defined, provided that it has a structure of $Sr_2Nb_2O_7$. As the host material, for example, usable is any of $Sr_2Nb_2O_7$, $Sr_2Ta_2O_7$, $Ca_2Nb_2O_7$, $Ca_2Ta_2O_7$, $La_2Ti_2O_7$, $Nd_2Ta_2O_7$, and solid solutions of these compounds.

Now, the seventeenth aspect of the present invention is directed to the production of the crystal-oriented ceramic of the invention according to any of the sixth to fourteenth aspects. In this seventeenth aspect, the host material to be used has a magnetoplumbite-type structure-associated crystal structure.

In this aspect, the host material may be a ferromagnetic substance.

In this, the host material may also be in the form of composite ceramic grains having the guest material as epitaxially formed and grown on at least a part of their surfaces, like in the thirteenth aspect.

The host material to be used in this seventeenth aspect is referred to hereinafter.

The host material shall have a magnetoplumbite-type structure-associated structure. As examples of the host material of that type, referred to are compounds having a magnetoplumbite-type structure which is represented by a general formula, $MO.6Fe_2O_3$ (where M indicates Ba, Sr, Pb, La or the like).

The "magnetoplumbite-type structure-associated structure" as referred to herein indicates a crystal structure that has the magnetoplumbite-type structure in at least a part of it. For example, mentioned are compounds having both the magnetoplumbite-type structure and spinel-type-structured layers of $MFe_2O_4$ in the crystal structure, such as $BaM_2Fe_{16}O_{27}$, $Ba_2M_2Fe_{12}O_{22}$ and $Ba_3M_2Fe_{24}O_{41}$ (where M indicates Co, Fe, Mn, Ni, Zr, Mg, Cu or the like).

Preferably, the host material is such that the dimension (length of the major axis) is not smaller than 0.5 µm. The host material of that type is energetically favorable. Therefore, using the host material of that type, it is easy to epitaxially form or re-arrange the guest material around the host material. In addition, large crystals can be formed as a result of the epitaxial growth or re-arrangement of the guest material around the host material. Especially in this case, the crystals of the guest materials are easily enlarged due to the principle of the Ostwald growth, in the grain-growth step which will be referred to hereinunder.

Even more preferably, the dimension of the expanded c-plane is 5 µm or larger.

In order to finally obtain a crystal-oriented ceramic product of a single phase of the guest material only, some compositional limitations will be needed in the combination of the host material, the raw material of the guest material, and the guest material. For example, referred to is a combination of the guest material and the host material in which the elements constituting the former shall include those constituting the latter.

For example, when $PbFe_{12}O_{19}$ is used as the host material and powders of $NbO_3$, PbO, $Fe_2O_3$, $ZrO_2$, TiO, etc. are used as the raw materials of the guest material, then a crystal-oriented ceramic of a single phase of only the guest material of $PbFe_{1/2}Nb_{1/2}O_3$ (PFN), $Pb(Zr,Ti)O_3$-PFN or the like can be obtained.

On the other hand, when $BaFe_{12}O_{19}$ is used as the host material and powders of $BaCO_3$, $Fe_2O_3$, $Nb_2O_5$, PbO, $ZrO_2$, $TiO_2$, etc. are used as the raw materials of the guest material, then a crystal-oriented ceramic of a single phase of only the guest material of $BaFe_{1/2}Nb_{1/2}O_3$ (BFN), $Pb(Zr,Ti)O_3$-BFN or the like can be obtained. Needless to say, if crystal-oriented ceramics which are not in the form of a single phase are intended to be obtained, any desired compounds of the host material and the guest material can be combined in any desired compositional combination.

The host material to be used in this aspect may be in the form of composite ceramic grains as prepared by epitaxially forming and growing the guest material around at least a part of the surfaces of the grains of the host material.

Using the host material of that type facilitates the epitaxial growth and re-arrangement of the guest material around the composite ceramic grains in the step of producing the product, crystal-oriented ceramic, whereby the degree of orientation of the product is increased.

The composite ceramic grains are functional composite grains each comprising a magnetic core and a coating phase having various functions of dielectricity, electroconductivity, ionic conductivity, thermoelectricity, piezoelectricity, etc. When put in a magnetic field, the composite ceramic grains can be moved, re-arranged and oriented. Apart from their use as the host material in the production of oriented ceramics, the composite ceramic grains can be employed as disperse particles whose functions are controllable in a magnetic field.

The composite ceramic grains can be produced by processing the host material in a solid phase, flux, solution or gaseous phase.

Especially preferred are the flux method where the host material is processed in a molten salt, and the solution method such as a hydrothermal method where the host material is processed in a liquid phase, as easily giving good composite ceramic grains having a large coated area.

Preferably, the host material is oriented by shaping and sintering it in a magnetic field.

In general, compounds having a magnetoplumbite-type structure have an axis of easy magnetization in the direction of the c-axis.

Therefore, if the compound is in external magnetic field, it receives a torque, which is represented by;

$$Th = H \times I$$

where Th indicates the torque;
H indicates the intensity of the external magnetic field;
I indicates the magnetic moment in the direction of the axis of easy magnetization, and the crystal grains of the compound can be arranged in such a manner that the c-plane of each crystal grain intersects the external magnetic field at right angles.

Accordingly, if the host material is shaped or sintered in a magnetic field (that is, the host material is shaped or sintered while external magnetic force is applied thereto), obtained is a shaped body in which the crystal grains constituting the host material are unified in a certain direction, or that is, the host material is oriented.

In this case, the direction of the magnetic field to be applied to the host material is not specifically defined. If, however, the host material is in the form of magnetoplumbite-type-structured grains of which the c-plane is expanded, it is desirable that the magnetic field is applied to the host material in the direction that is perpendicular to the plane to which pressure or shear stress is directed.

In this preferred case, the morphological anisotropy-dependent orientation of the grains of the host material and the magnetic field-dependent orientation thereof produce a synergistic result, whereby the crystal oriented-ceramic to be finally obtained can have a higher degree of orientation.

The crystal-oriented ceramic to be obtained in this aspect is characterized in that at least a part of the guest material is oriented relative to the {111} plane of the perovskite-type structure.

This is because the c-plane of the magnetoplumbite-type structure has lattice conformity with the {111} plane of the perovskite-type structure, as has been mentioned hereinabove.

Of ordinary ferroelectric substances and piezoelectric substances having a perovskite-type structure, those of which the crystal symmetry is in a rhombohedral system have an axis of easy polarization in the direction of the <111> axis.

Therefore, if the ferroelectric or piezoelectric substance of that type is oriented relative to the {111} plane of the perovskite-type structure, the crystal-oriented ceramic product to be finally obtained can have improved in its characteristics and is especially suitable for use in ferroelectric materials or piezoelectric materials.

Now, the eighteenth aspect of the present invention is directed to the use of the crystal-oriented ceramic of any one of the first to seventh aspects of the invention as a substrate. In this aspect, a functional thin film comprising crystals of an isotropic perovskite-type-structured or layered perovskite-type-structured polycrystalline compound is formed on the substrate of the crystal-oriented ceramic to give a device.

The nineteenth aspect of the present invention is directed to one embodiment of the device of the eighteenth aspect. In this aspect, the substrate made of poly-crystals has at least one crystal plane oriented predominantly and not smaller than 20% of crystal orientation degrees in the Lotgering method.

These eighteenth and nineteenth aspects are referred to hereinunder.

If a functional thin film is grown on the substrate with the degree of orientation of smaller than 20%, it is often difficult to obtain a functional thin film satisfactorily oriented to such a degree that the film exhibits excellent characteristics.

More preferably, the degree of orientation of the substrate is 50% or higher. If a functional thin film having the properties to be mentioned hereinunder is formed on the crystal-oriented ceramic substrate of that preferred type, anyone can obtain low-priced devices, such as ferroelectric memories which have large remnant polarization and which are hardly fatigued.

The functional thin film as referred to herein indicates a filmy substance of which the functions and characteristics depend on its crystal orientation. This includes, for example, thin films of substances that are usable as dielectric materials, pyroelectric materials, piezoelectric materials, ferroelectric materials, magnetic materials, ion-conductive materials, electron-conductive materials, thermoelectric materials, abrasion-resistant materials, etc.

If the substrate has a degree of orientation of 80% or higher, and if devices that are usable as high-temperature superconductive elements are formed using the substrate, the devices formed exhibit especially excellent characteristics. If a functional thin film having electroconductivity anisotropy is formed on the substrate, obtainable are devices that function as electroconductivity-anisotropic elements.

The crystal-oriented ceramic substrate of these aspects is a polycrystalline substrate in which the individual grains are oriented. The degree of Lotgering orientation of the substrate is not smaller than 20%.

Therefore, a functional thin film can be formed on the crystal-oriented ceramic substrate, with the crystal axis of the film being oriented relative to the crystal lattice of the substrate. Accordingly, the functional thin film thus formed on the crystal-oriented ceramic substrate is oriented to the same degree as that of orientation of the substrate.

In addition, since the crystal-oriented ceramic substrate is of a polycrystalline substance, the production costs for producing it are lower than those for producing single crystal substrates. Moreover, it is easy to produce large-sized substrates in these aspects of the invention. Therefore, using such large-sized substrates, the yield in producing large-sized devices is increased.

The crystallization temperature at which the functional thin film is formed on the crystal-oriented ceramic substrate in the invention may be lower than that at which the same film is formed on a non-oriented polycrystalline substrate. Therefore, the degree of orientation of the functional thin film formed on the crystal-oriented ceramic substrate can be increased, whereby the performance of the resulting device is improved.

In addition, when a functional thin film is formed on the crystal-oriented ceramic substrate of the invention to produce a device, the range of solid solutions of the two, film and substrate can be widely varied. Therefore, the optimum substrate having a uniform composition and having good lattice conformity with the functional thin film to be formed thereon can be selected. Using the optimum substrate, anyone can produce excellent devices.

It is desirable that the crystal-oriented ceramic substrate is fully sintered and densified through heat treatment and thereafter its surface is leveled through polishing treatment, prior to the formation of a functional thin film thereon.

As has been mentioned hereinabove, according to the present invention, it is possible to easily produce a low-priced and large-sized, crystal-oriented ceramic substrate, on which can be formed a functional thin film having a high degree of orientation.

In the nineteenth aspect, the predominantly-oriented crystal plane of the polycrystalline, crystal-oriented ceramic substrate is preferably the {100} plane of the isotropic perovskite-type compound constituting it, as expressed in the form of a pseudo-cubic system.

Using the substrate of such a preferred type, memory devices having increased capacity, improved fatigue-resistance and electronic conductor devices having improved electronic conductivity can be obtained.

To produce optical devices, preferably used are biaxially-oriented substrates of an isotropic perovskite-type compound. These substrates can be produced by using a blade-like host material of an $Sr_2Nb_2O_7$-type-structured compound.

As has been mentioned hereinabove, the functional thin film to be formed in these aspects is a filmy substance of which the functions and characteristics depend on its crystal orientation. This includes, for example, thin films of substances that are usable as dielectric materials, pyroelectric materials, piezoelectric materials, ferroelectric materials, magnetic materials, ion-conductive materials, electron-conductive materials, thermoelectric materials, abrasion-resistant materials, etc.

The performance of the device of the invention depends on the type of the functional thin film formed on the substrate.

Examples of the device of the invention are mentioned below, in which the compounds specifically referred to are to form functional thin films.

Using $Pb(Zr,Ti)O_3$, $PbTiO_3$, $SrBi_2Ta_2O_9$ and the like, ferroelectric, non-volatile memory devices can be obtained.

Using $(Sr,Ba)TiO_3$ and $(Pb,La)(Zr,Ti)O_3$, DRAM devices can be obtained.

Using $(Pb,La)TiO_3$ and the like, pyroelectric sensors can be obtained. Using semiconductive $SrTiO_3$ and semiconductive $BaTiO_3$, transistors (FET, etc.) can be obtained.

Using $Pb(Zr,Ti)O_3$, $Bi_{0.5}Na_{0.5}TiO_3$ and the like, acceleration sensors can be obtained.

Using $(Ln,A)MnO_3$ such as $Nd_{0.7}Sr_{0.3}MnO_3$, magnetic sensors can be obtained. In this, Ln indicates a rare earth element, and A indicates an alkaline earth element.

Using $LaLiTi_2O_6$, $BaCeO_3$ and the like, ion-conductive devices (chemical sensors, cell devices, etc.) can be obtained.

Using $YBa_2Cu_3O_7-a$, $Bi_2Sr_2Ca_{n-1}Cu_nO_x$ and the like, superconductive devices such as SQUID can be obtained.

Using a plurality of compounds selected from the above, functional thin films can be formed, with which are produced various devices having multiple functions.

The devices mentioned hereinabove include those having functional thin films on the crystal-oriented ceramic substrate of the invention, and others such as those having electrodes or wiring structures thereon.

If, for example, insulating, crystal-oriented ceramic substrates are desired to be converted into electroconductive ones for intended devices, it is desirable that filmy electrodes comprising $LaNiO_3$, $La(Ni,Co)O_3$, $(Sr,Ca)RuO_3$, $(La,Sr)CoO_3$, Nb-doped $SrTiO_3$ or the like are epitaxially grown on the crystal-oriented ceramic substrate of the invention.

In the present invention, where a functional thin film is formed on the crystal-oriented, polycrystalline ceramic substrate and where the degree of Lotgering orientation of the crystal-oriented ceramic substrate is not smaller than 20%, the functional thin film shall follow the orientation of the crystal-oriented ceramic substrate. In other words, the functional thin film formed on the substrate is oriented similarly to the substrate. Therefore, the device of the present invention comprising such a functional thin film formed on the substrate shall have excellent orientation-dependent characteristics of the film.

Since the crystal-oriented ceramic substrate of the invention is a polycrystalline one, the costs for producing it are lower than those for producing a single crystal substrate. In addition, it is easy to produce the substrate of the invention having a large surface area. Therefore, according to the present invention, large-size devices can be produced.

As has been mentioned hereinabove, according to the present invention, a functional thin film having a high degree of orientation can be formed on the substrate. Thus, according to the present invention, low-priced, large-size devices can be produced with ease.

Now, the present invention is described in more detail hereinunder with reference to the following description and the appended drawings.

DETAILED DESCRIPTION OF THE INVENTION

EXAMPLE 1

This is to demonstrate the production of a sample of the crystal-oriented ceramic of the present invention. In this, referred to are FIG. 1 to FIG. 3.

The crystal-oriented ceramic sample produced herein had a degree of Lotgering orientation of not smaller than 10%, while having an isotropic perovskite-type structure and comprising a Bi-containing oxide.

The method of producing the crystal-oriented ceramic sample of this Example is referred to hereinafter.

In this Example, bismuth titanate ($Bi_4Ti_3O_{12}$) was used as the host material. A mixture of three substances, $Bi_2O_3$, $Na_2CO_3$ and $TiO_2$ as mixed in a molar ratio of Bi/Na/Ti= 1/1/2 was used as the starting material of the guest material.

The guest material produced from the starting material was bismuth sodium titanate ($Bi_{0.5}Na_{0.5}TiO_3$).

Figure 1:
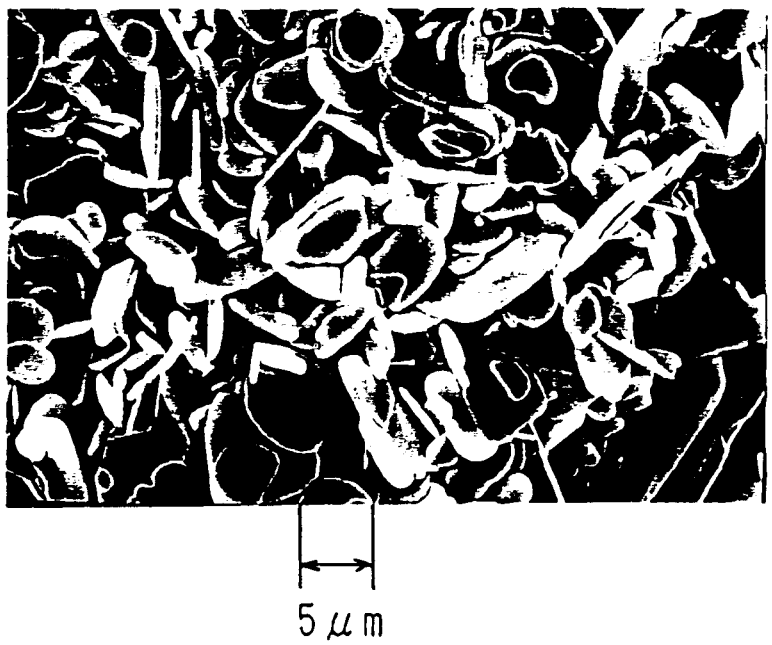
FIG. 1 is a picture (×1500) taken with a scanning electron microscope (SEM), which shows the grain structure of the host material used in Example 1.

Powders of bismuth oxide and titanium oxide were mixed with powders of sodium chloride and potassium chloride, and the resulting mixture was heated at 1050° C. to obtain a powder of plate-like grains of bismuth titanate, which is shown in FIG. 1. This is the host material used herein.

FIG. 1 is a picture taken with a scanning electron microscope (SEM).

The host material and the starting material of the guest material were weighed in a ratio of ¼ in terms of Ti, which is in the host material and in the guest material to be produced from the starting material.

Next, the host material and the starting material of the guest material were mixed in ethanol, using a ball mill.

Next, the resulting mixture was dried in powder. The resulting powder was shaped, using a uniaxial die-pressing machine, to give a shaped green body disc. In the thus-obtained green body, the host material was oriented. After this, the green body disc was further compressed under cold-isostatic pressure.

Next, the green body disc was heated in an oxygen atmosphere at 800° C. for 2 hours and at 1100° C. for further 2 hours to obtain a sintered disc.

After this, the surface of the sintered disc was polished to obtain a crystal-oriented ceramic sample of this Example.

Figure 2:
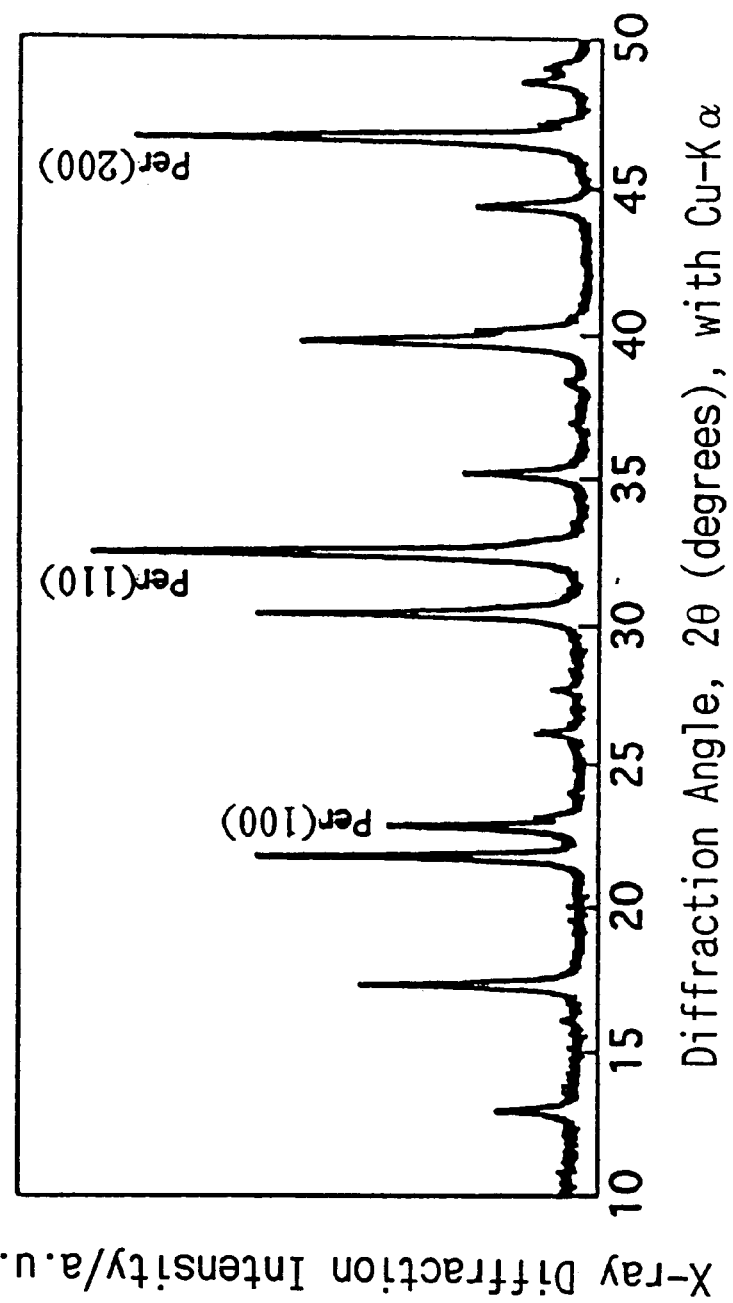
FIG. 2 is an X-ray diffraction pattern of the crystal-oriented ceramic sample of the present invention obtained in Example 1.

Next, the polished surface of the crystal-oriented ceramic sample obtained herein was subjected to X-ray diffractometry, in which the pattern obtained is shown in FIG. 2. In this drawing, Per ( ) indicates the Miller index of the perovskite-type phase of the sample as expressed in the form of a pseudo-cubic system. For example, Per(100) means (100) of the perovskite-type phase.

For comparison, prepared was a comparative sample of bismuth sodium titanate having the same composition as that of the crystal-oriented ceramic prepared above, but not oriented, and this was subjected to X-ray diffractometry. Its pattern is shown in FIG. 3.

Figure 3:
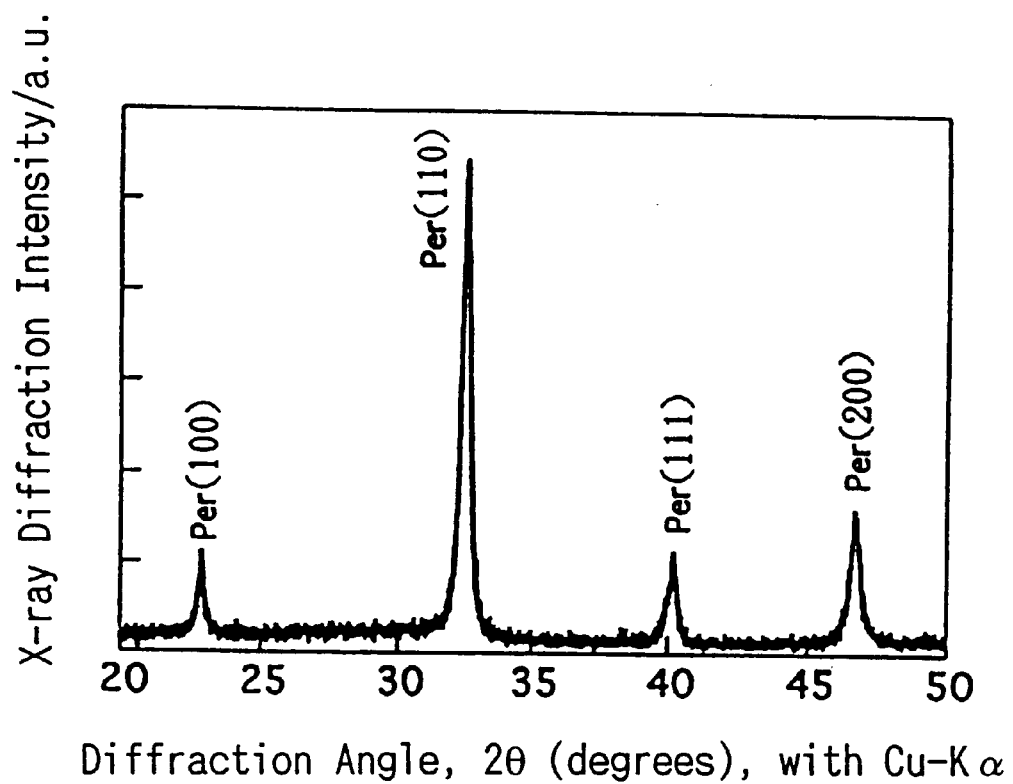
FIG. 3 is an X-ray diffraction pattern of the non-oriented, powder sample prepared in Example 1 as a comparative sample.

Referring to FIGS. 2 and 3, it is known that, in the pattern obtained from the crystal-oriented ceramic sample of this Example, the ratio of the peak of the diffraction intensity, $\alpha$, at the (100) plane and at the (200) plane of the sample to the peak of the diffraction intensity, $\beta$, at the (110) plane thereof, or that is, the ratio of $\alpha/\beta$, is larger than the ratio $\alpha/\beta$ in the pattern obtained from the non-oriented bismuth sodium titanate of the comparative sample. The crystal planes as referred to herein are expressed for the crystal of bismuth sodium titanate in the form of a pseudo-cubic system.

The degree of Lotgering orientation of the crystal-oriented ceramic sample of this Example, relative to its {100} plane, was 34%.

These data obtained herein verify that the sample of this Example was a crystal-oriented ceramic having an isotropic perovskite-type structure and oriented relative to its {100} plane.

The peak in the X-ray diffraction pattern from the host material in the crystal-oriented ceramic sample differs from that from bismuth titanate. This is because the reaction of the host material and the guest material gave a layered perovskite-type compound, $Na_{0.5}Bi_{4.5}Ti_4O_{15}$.

EXAMPLE 2

This is to demonstrate the production of a crystal-oriented ceramic sample comprising bismuth sodium titanate, using a doctor-blading method.

In the method of this Example, bismuth titanate ($Bi_4Ti_3O_{12}$) was used as the host material. A mixture of three substances, $Bi_2O_3$, $Na_2CO_3$ and $TiO_2$ as mixed in a molar ratio of Bi/Na/Ti=1/1/2 was used as the starting material of the guest material.

The guest material produced from the starting material was bismuth sodium titanate ($Bi_{0.5}Na_{0.5}TiO_3$).

The host material and the starting material of the guest material were weighed in a ratio of ¼ in terms of Ti, which is in the host material and in the guest material to be produced from the starting material.

Next, ethanol and toluene were added to the host material and the starting material of the guest material, which were mixed in a ball mill. A binder of polyvinyl butyral and a plasticizer of dibutyl phthalate were added thereto. After having been further mixed, a uniform slurry was obtained.

The resulting slurry was tape-cast, using a doctor-blading apparatus, to obtain a green strip. After having been dried, the strip had a thickness of about 0.1 mm.

Next, the green strip was heated in air up to 600° C. over a period of 12 hours and kept at 600° C. for 2 hours, and thereafter further heated in an oxygen atmosphere at 1100° C. for further 2 hours to obtain a crystal-oriented ceramic strip of this Example.

Figure 4:
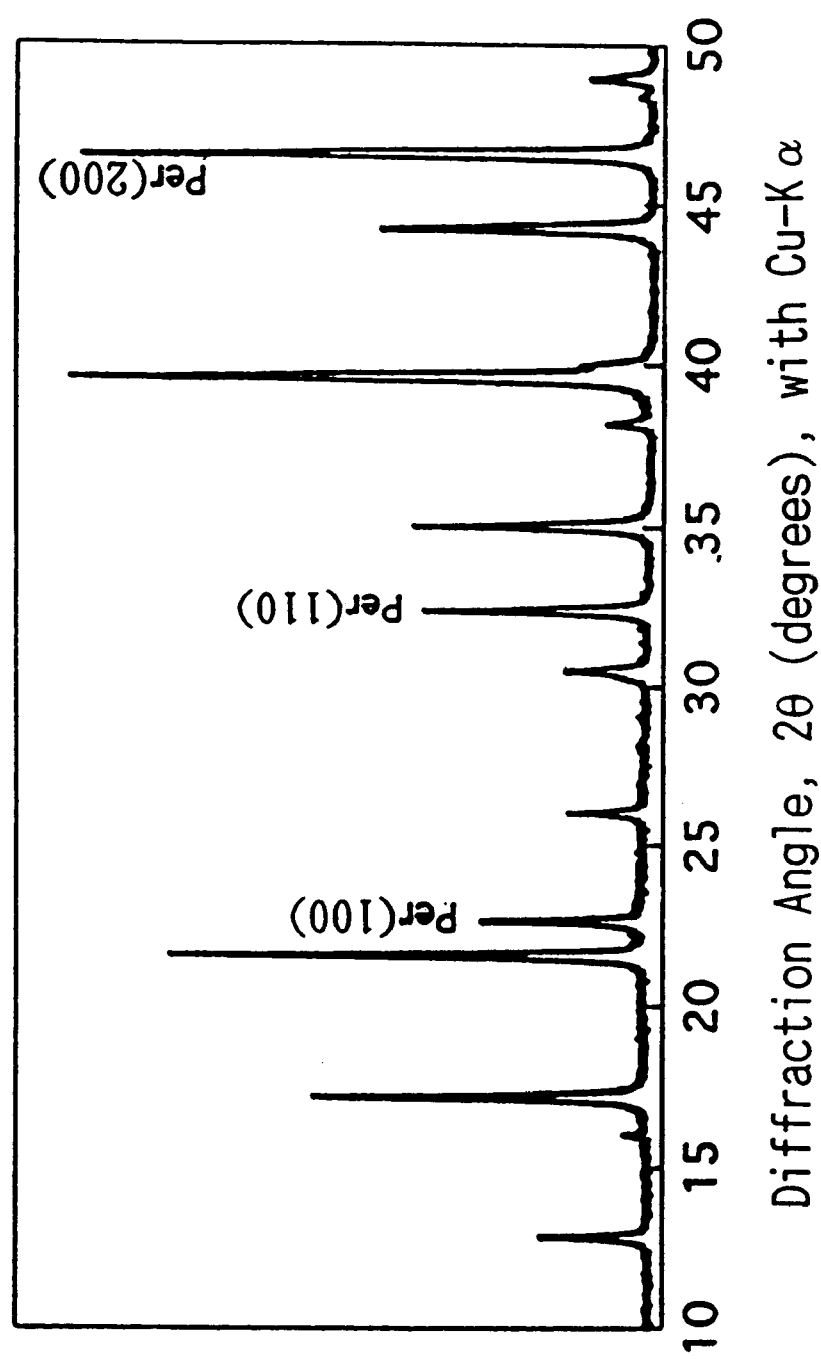
FIG. 4 is an X-ray diffraction pattern of the crystal-oriented ceramic sample of the present invention obtained in Example 2.

The sheet surface of the sample was subjected to X-ray diffractometry in the same manner as in Example 1, in which the pattern obtained is shown in FIG. 4.

Referring to this drawing, it is known that the peaks in the X-ray diffraction pattern obtained from the crystal-oriented ceramic strip sample of this Example at its (100) plane and (200) plane are much larger than those obtained from the non-oriented bismuth sodium titanate in Example 1 and shown in FIG. 3.

The degree of crystal orientation of the sample of this Example (Sample 2), relative to its {100} plane, was 66%.

EXAMPLE 3

Figure 5:
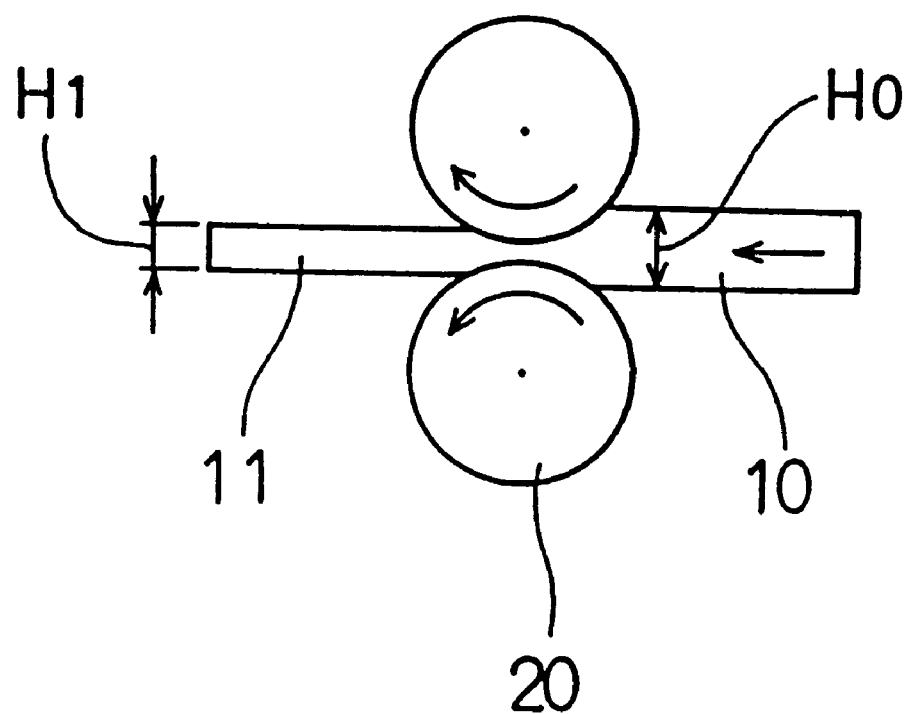
FIG. 5 is a graphic view showing the twin rollers used for roll-pressing in Example 3.

This Example is to demonstrate the method for producing a crystal-oriented ceramic of the invention and the crystal-oriented ceramic sample obtained, with reference to FIG. 5.

The production method of this Example comprises preparing a morphologically anisotropic, particulate host material having a layered perovskite-type structure, and also a starting material capable of producing a guest material having an isotropic perovskite-type structure.

In addition to the above, further prepared herein is an additive having the ability to convert the host material into the guest material used herein or into any other guest material that has an isotropic perovskite-type structure but is different from the guest material used herein. Next, the host material, the guest material and the additive are mixed, roll-pressed, and thereafter sintered under heat.

In this Example, bismuth titanate ($Bi_4Ti_3O_{12}$) was used as the host material. A mixture of $Bi_2O_3$, $Na_2CO_3$ and $TiO_2$ was used as the starting material of the guest material. $Na_2CO_3$ and $TiO_2$ were used as the additive.

The guest material produced from the starting material was bismuth sodium titanate ($Bi_{0.5}Na_{0.5}TiO_3$). The host material, bismuth titanate was prepared in the same manner as in Example 1.

The host material, the starting material of the guest material, and the additive were mixed to give a mixture, in which the molar ratio of the substances weighed was $Bi_4Ti_3O_{12}/Bi_2O_3/Na_2CO_3/TiO_2=4/7/15/48$. This ratio corresponds to an atomic ratio of $Bi/Na/Ti=1/1/2$, which is the same as the atomic ratio of the elements constituting the guest material.

Ethanol and toluene were added to the resulting mixture, which was mixed in a ball mill. A binder of polyvinyl butyral and a plasticizer of dibutyl phthalate were added thereto and further mixed. The resulting uniform slurry was tape-cast, using a doctor-blading apparatus, to obtain green strips.

Next, five these strips were laminated at a pressure of 100 kg/cm² at 80° C. for 10 minutes. The resulting laminate was roll-pressed by passing it through twin rollers 20 with the distance therebetween being gradually reduced, as in FIG. 5.

After having been thus roll-pressed, obtained was a primary roll-pressed strip 11, of which the thickness was 50% of that of the original, non-roll-pressed laminate 10.

Four these primary roll-pressed strips were laminated under the same condition as above to obtain a laminate. This was heated up to 600° C. in an oxygen atmosphere over a period of 12 hours and then kept at 600° C. for 2 hours, whereby this was dewaxed and the guest was in-situ synthesized. The thus-dewaxed laminate was heated in an oxygen atmosphere at 1100° C. for 10 hours to obtain a crystal-oriented ceramic sample of the invention.

The thus-sintered, crystal-oriented ceramic sample was subjected to X-ray diffractometry on the sheet surface, which gave a pattern having no peak for bismuth titanate but having a peak for the isotropic perovskite-type-structured single phase of $Bi_{0.5}Na_{0.5}TiO_3$.

The degree of crystal orientation of this sintered sample relative to its {100} plane was measured to be 80% in its surface and 64% in its inside. The density of this sintered sample was measured to be 80% of the theoretical density thereof.

On the other hand, the dewaxed laminate was directly sintered in an oxygen atmosphere at 1100° C. for 2 hours. The thus-sintered sample was subjected to X-ray diffractometry, which gave a pattern having no peak for bismuth titanate but having a peak for the isotropic perovskite-type-structured single phase of $Bi_{0.5}Na_{0.5}TiO_3$. The degree of crystal orientation of this sintered sample relative to its {100} plane was measured to be 23% in its surface and 16% in its inside.

This Example verified that the production method of the present invention gives crystal-oriented ceramics having a high degree of orientation.

EXAMPLE 4

In this Example, the final laminate obtained in Example 3 was further roll-pressed to give a secondary roll-pressed strip, which was then sintered to obtain a crystal-oriented ceramic sample.

In this, the laminate was roll-pressed, using the same twin rollers as those used in obtaining the primary roll-pressed strip, to thereby have a thickness of ½ of its original thickness.

Next, the secondary roll-pressed strip was heated up to 600° C. in an oxygen atmosphere over a period of 12 hours, then kept at 600° C. for 2 hours and thereafter at 1100° C. for 10 hours to obtain a crystal-oriented ceramic sample.

Figure 6:
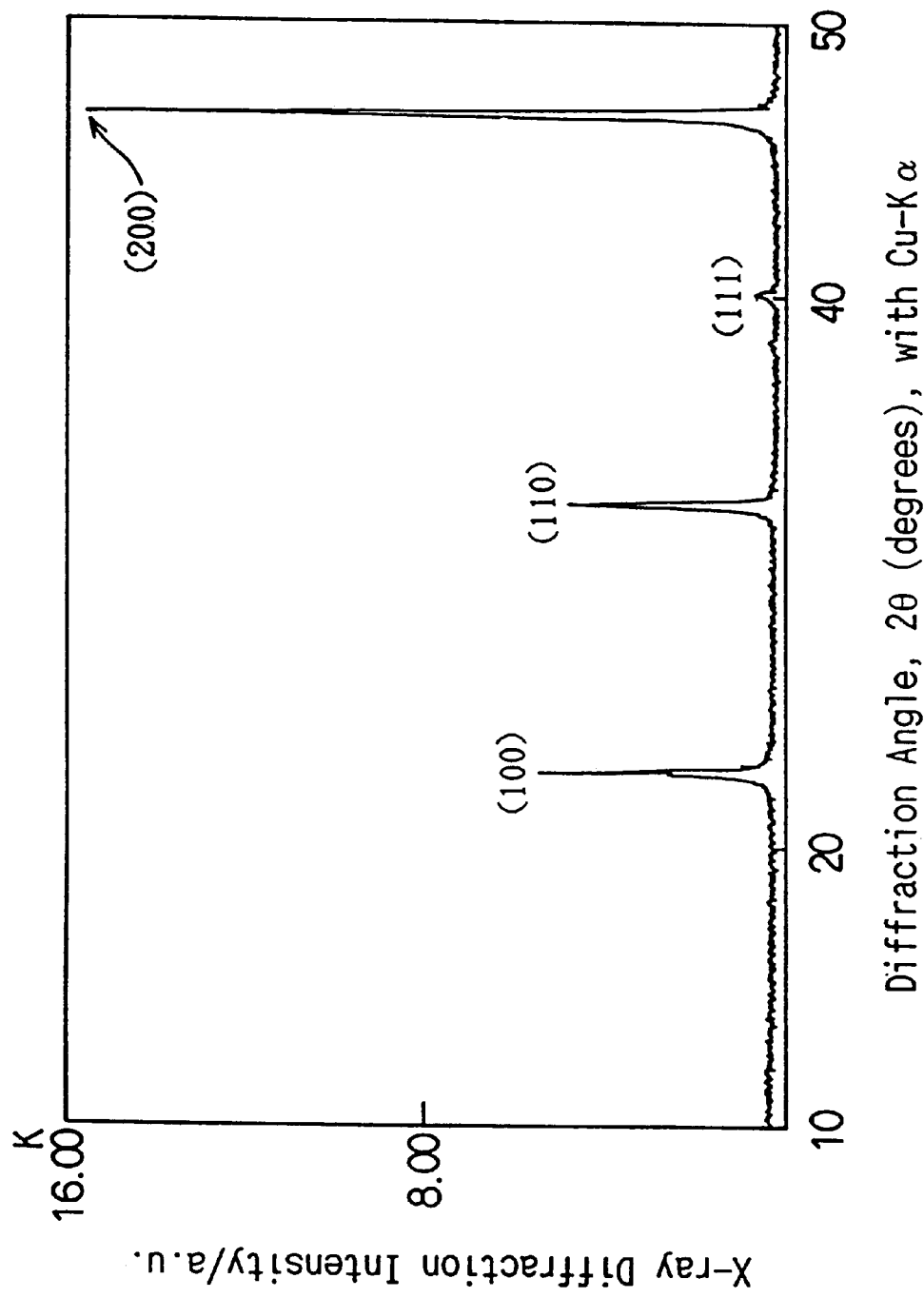
FIG. 6 is an X-ray diffraction pattern of the crystal-oriented ceramic sample of the present invention obtained in Example 4.

The thus-obtained, crystal-oriented ceramic sample was subjected to X-ray diffractometry on the sheet surface, which gave a pattern having no peak for bismuth titanate but having a peak for the isotropic perovskite-type-structured single phase of $Bi_{0.5}Na_{0.5}TiO_3$, as in FIG. 6.

The degree of crystal orientation of this crystal-oriented ceramic sample relative to its {100} plane was measured to be 80% in its surface and 69% in its inside.

This Example verified that the production method of the present invention gives crystal-oriented ceramics having a high degree of orientation.

EXAMPLE 5

The dewaxed compound laminate as obtained in Example 3 was compressed at a cold-isostatic pressure of 3000 kg/cm², whereby its density was increased by about 25%. The thus-compressed laminate was heated in an oxygen atmosphere at 1100° C. or 1150° C. for 10 hours to obtain crystal-oriented ceramic samples of the invention.

Figure 7:
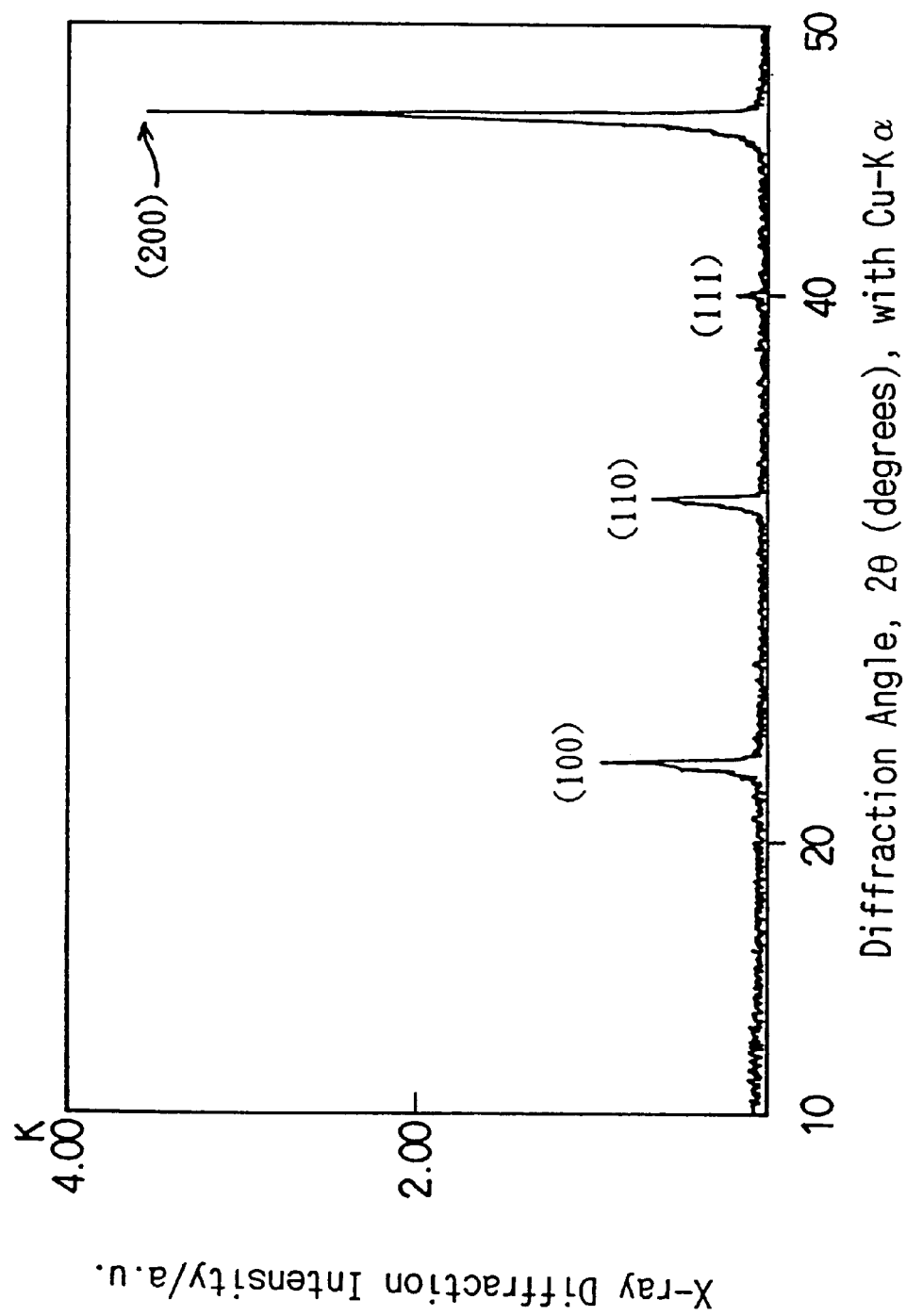
FIG. 7 is an X-ray diffraction pattern of the crystal-oriented ceramic sample of the present invention obtained in Example 5.

These crystal-oriented ceramic samples were subjected to X-ray diffractometry on the sheet surface. The pattern obtained in the X-ray diffractometry of the sample sintered at 1150° C. is shown in FIG. 7. The patterns for these samples had no peak for bismuth titanate (see FIG. 7) but had a peak for the isotropic perovskite-type-structured single phase of $Bi_{0.5}Na_{0.5}TiO_3$.

The degree of crystal orientation of these crystal-oriented ceramic samples relative to their {100} plane was measured to be 56% (when sintered at 1100° C.) and 80% (when sintered at 1150° C.) in their inside. These sintered samples were measured to have a density of 90% (when sintered at 1100° C.) and 96% (when sintered at 1150° C.) of the theoretical density thereof.

EXAMPLE 6

A crystal-oriented ceramic sample was produced in the same manner as in Example 5, except that starting materials of $Bi_4Ti_3O_{12}$, $Bi_2O_3$, $TiO_2$, $Na_2CO_3$ and $K_2CO_3$ were used to give a composition of $Bi_{0.5}(Na_{0.85}K_{0.15})_{0.5}TiO_3$, and that the sintering was effected at 1150° C. for 10 hours.

The thus-obtained, crystal-oriented ceramic sample was subjected to X-ray diffractometry, which gave a pattern having a peak only for the isotropic perovskite-type-structured $Bi_{0.5}(Na_{0.85}K_{0.15})_{0.5}TiO_3$. The degree of crystal orientation of the sample relative to its {100} plane was measured to be 70% in its inside. The density of the sintered sample was measured to be 96% of the theoretical density thereof.

EXAMPLE 7

A crystal-oriented ceramic sample was produced in the same manner as in Example 6, except that starting materials of $Bi_4Ti_3O_{12}$, $Bi_2O_3$, $TiO_2$, $Na_2TiO_3$ and $K_2TiO_3$ were used to give a composition of $Bi_{0.5}(Na_{0.85}K_{0.15})_{0.5}TiO_3$.

The thus-obtained, crystal-oriented ceramic sample was subjected to X-ray diffractometry, which gave a pattern having a peak only for the isotropic perovskite-type-structured $Bi_{0.5}(Na_{0.85}K_{0.15})_{0.5}TiO_3$. The degree of crystal orientation of the sample relative to its {100} plane was measured to be 58% in its inside. The density of the sintered sample was measured to be 92% of the theoretical density thereof.

EXAMPLE 8

This Example is to demonstrate the production of a crystal-oriented ceramic sample of the present invention, in which was used a guest material having a perovskite-type structure, or a material capable of producing the guest material through reaction.

In this, seed crystals of a ferroelectric substance having a magnetoplumbite-type structure-associated crystal structure were used as the host material, and at least a part of the guest material was epitaxially grown or re-arranged on the surface of the host material.

While being grown or re-arranged, at least a part of the crystal plane or axis of the guest material was oriented in accordance with the orientation of the crystal plane or axis of the host material. In that manner, a crystal-oriented ceramic sample was produced herein.

The crystal-oriented ceramic sample produced herein was in the form of a single phase of the guest material only. This is because a substance having the ability to convert the host material into the guest material, which will be referred to hereinunder, was added to the system of producing the ceramic.

For the epitaxial growth of the guest material on the host material, the c-plane of the magnetoplumbite-type-structured host material had lattice conformity with the {111} plane of the perovskite-type-structured guest material.

The production method of this Example is described in detail hereinunder.

In this Example, $BaFe_{12}O_{19}$ was used as the host material, and a mixed powder of $BaCO_3$ and $Nb_2O_5$ was used as the material to obtain the guest material of $BaFe_{1/2}Nb_{1/2}O_3$ (BFN) through reaction.

The host material and the additive were weighed in a molar ratio of host material/$BaCO_3$/$Nb_2O_5$ of 1/23/6, in order to finally obtain a single phase of BFN through reaction, and these were wet-mixed or dry-mixed in a ball mill or the like to prepare a powder mixture. This is the "mixing step".

Next, this powdery mixture was compressed under uniaxial pressure in a magnetic field of from 10 to 15 MGOe in the pressing direction (this is so-called vertical magnetic-field molding) to obtain a shaped disc sample. This is the "shaping step".

The disc sample was heated in an electric furnace at from 1000 to 1200° C. for from 0.5 to 2 hours, with $BaCO_3$ in the starting material being decomposed ($BaCO_3 \rightarrow BaO+CO_2$), to obtain a pre-sintered body having the guest material partly on the surface of the host material.

In this step, if expanded too much, the pre-sintered body was subjected to cold isostatic pressure (CIP) to thereby increase its density.

This is the former half of the "heating step".

The pre-sintered body was again heated in an electric furnace at from 1200 to 1400° C. for from 1 to 24 hours to complete the reaction. Thus, a sintered body of a single phase of BFN was obtained.

This is the latter half of the "heating step".

The sintered body sample thus obtained as a result of the above-mentioned process was subjected to X-ray diffractometry, by which the crystal orientation of the sample was evaluated. The pattern of the X-ray diffractometry of the sample on its surface that is vertical to the pressure as applied thereto during the shaping step (that is, the surface of the sample that is vertical to the direction of the magnetic field) gave a higher peak for the {111} plane than the peak for the same plane in the X-ray diffraction pattern of an ordinary BFN powder. This verifies that the sample obtained herein was oriented relative to the {111} plane of its perovskite-type structure. The degree of orientation of the sample was measured to be not smaller than 10% according to the Lotgering method.

For comparison, powders of $BaCO_3$, $Fe_2O_3$ and $Nb_2O_5$ were weighed and mixed in a molar ratio of 4/1/1, without using the host material, and shaped and heated in the same manner as above. However, no crystal orientation was observed in the sintered body as obtained in this comparative case.

This Example verifies that crystal-oriented ceramics of perovskite-type-structured compounds can be obtained easily and inexpensively according to the production method of the present invention, without requiring the expensive and inefficient technique of growing single crystals.

EXAMPLE 9

This Example is to demonstrate the production of a crystal-oriented ceramic sample of the present invention, with reference to FIG. 8 to FIG. 12. The characteristics of the sample produced herein were compared with those of a comparative sample also produced herein for comparison.

Figure 8A:
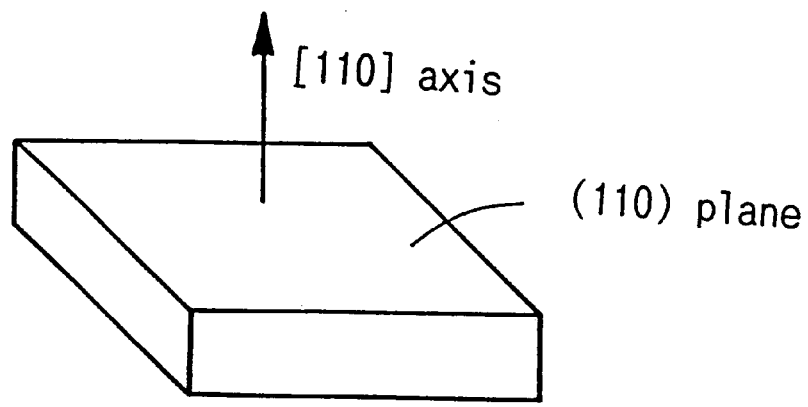
FIG. 8A is a graphic view showing the perovskite-type-structured, crystal-oriented ceramic sample obtained in Example 9, in which the sample is oriented relative to its {110} plane.

The crystal-oriented ceramic sample produced in this Example comprises at least partly a guest material having a perovskite-type structure, in which at least a part of the guest material is oriented relative to the {110} plane of the perovskite-type structure when expressed in the form of a pseudo-cubic system, as in FIG. 8A.

The guest material is $Pb_{0.8}Sr_{0.2}\{(Zr_{0.45}Ti_{0.55})_{0.7}(Ni_{1/3}Nb_{2/3})_{0.3}\}O_3$.

The crystal-oriented ceramic sample of this Example has a structure of $Sr_2Nb_2O_7$, and is produced from a mixture comprised of a host material of morphologically-anisotropic grains each having an expanded {010} plane (see FIGS. 9A and 9B), and an additive having the ability to convert the host material into the guest material.

In this Example, the mixture is shaped into a shaped body whereby at least a part of the host material is oriented relative to the {010} plane; and thereafter the shaped body is heated whereby at least a part of the guest material is oriented relative to the crystal plane or axis, according to the orientation of the host material.

The additive used herein is a powder mixture of PbO, $ZrO_2$, $TiO_2$ and NiO.

The host material used herein is $Sr_2Nb_2O_7$.

Now, the production method of this Example is described in detail hereinunder.

First, the host material of $Sr_2Nb_2O_7$ was prepared in the following manner.

Starting materials of $SrCO_3$ and $Nb_2O_5$ were mixed in a ratio of Sr/Nb=1/1 to give a mixed powder. To this was added the same weight of a mixed powder of KCl and NaCl (1/1 by mol). The resulting mixture was put into a platinum container and heated at 1200° C. for 8 hours.

After the heat treatment, KCl and NaCl were removed from the compounded powder in the container. As a result, obtained was the intended host material of blade-like, morphologically-anisotropic $Sr_2Nb_2O_7$ grains having a major axis of from 2 to 20 μm, a minor axis of from 0.5 to 2 μm and a thickness of about 0.1 μm. The grain of the host material has the crystal orientation shown in FIG. 9B.

Figure 10:
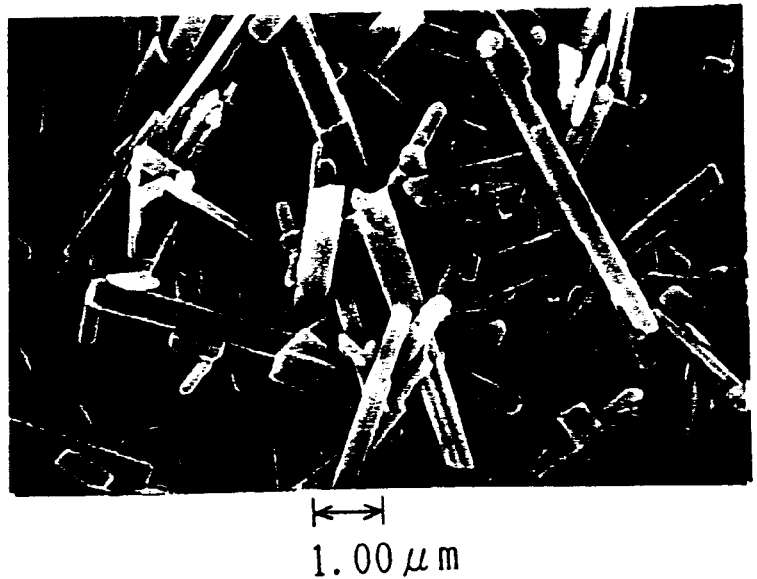
FIG. 10 is a SEM picture (×8000) of the host material used in Example 9.

The SEM picture of the host material is shown in FIG. 10.

The host material used in this Example is composed of blade-like, morphologically-anisotropic grains. In place of the host material of that type, also employable herein is a host material composed of flaky, morphologically-anisotropic grains as in FIG. 9A.

Next, the host material and the additive comprised of powders of PbO, $ZrO_2$, $TiO_2$ and NiO were weighed in a predetermined molar ratio in order that the crystal-oriented ceramic product to be finally obtained herein might be in the form of a single phase of the compound of the guest material.

The composition of the guest material is $Pb_{0.8}Sr_{0.2}\{(Zr_{0.45}Ti_{0.55})_{0.7}(Ni_{1/3}Nb_{2/3})_{0.3}\}O_3$. In this Example, the host material and the additive were mixed in such a manner that Sr and Nb of the composition of the guest material could be derived exclusively from the entire host material, or that is, the B-site ratio, Nb/(Zr+Ti+Ni+Nb), in the composition of the guest material could be 20% (this is nearly the same as the ratio by volume of the constitutive components).

With respect to 100 g of the powdery mixture of the host material and the additive, added was 60 cc of a mixed solution of toluene and ethanol (toluene/ethanol=3/2 by volume), and mixed for 24 hours in a ball mill. Next added thereto were a plasticizer and a binder of 3 g each (relative to 100 g of the powdery mixture), and further milled for 1 hour in a ball mill to obtain a slurry mixture.

Next, the slurry was tape-cast, using a doctor-blading apparatus, to give a sheet, which was then dried. A plurality of these strips cut out of the sheet, were laminated under pressure, and the resulting laminate was roll-pressed to obtain a green strip having a size of 20×20 mm and a thickness of 1 mm.

The degree of orientation of the host material in this green strip was measured according to X-ray diffractometry, which was found to be about 70% relative to the {010} plane of the $Sr_2Nb_2O_7$-type structure of the host material.

Next, the green strip was dewaxed at 600° C. for 2 hours, and thereafter compressed at a cold-isostatic pressure of 300 MPa for 2 minutes to thereby increase its density.

Next, this green strip was embedded in a powder having the same composition as that of the strip, and heated at 1300° C. for 10 hours in a closed MgO container.

The sintered body thus obtained as a result of the above-mentioned process had a single phase having a perovskite-type structure, and its relative density (measured density/theoretical density) was 95%.

Figure 11:
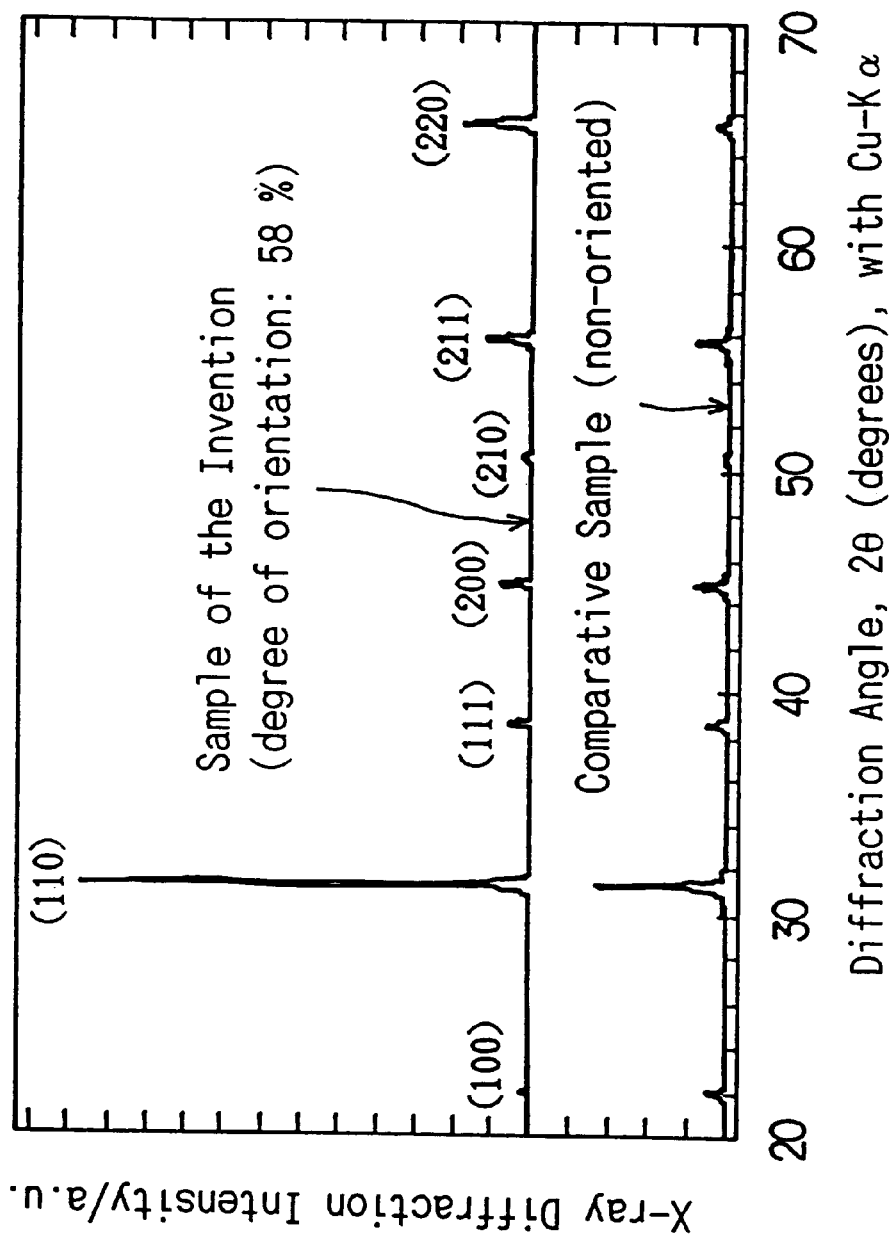
FIG. 11 shows an X-ray diffraction pattern of the crystal-oriented ceramic sample of the present invention obtained in Example 9, and an X-ray diffraction pattern of the non-oriented, polycrystalline ceramic sample prepared in Example 9 as a comparative sample; the two samples having the same composition.

The X-ray diffraction pattern of the sintered body is shown in FIG. 11, which gave higher peaks for the (110) and (220) planes of the perovskite-type structure than those for the other planes thereof.

The degree of orientation of the sintered body, when measured according to the Lotgering method, was 58% relative to the {110} plane.

On the other hand, a comparative ceramic sample having a perovskite-type structure was prepared herein according to an ordinary solid phase method. This is referred to hereinunder.

Powders of PbO, $ZrO_2$, $TiO_2$, NiO and $Nb_2O_5$ were weighed and mixed in order to finally give the composition of the above-mentioned guest material, $Pb_{0.8}Sr_{0.2}\{(Zr_{0.45}Ti_{0.55})_{0.7}(Ni_{1/3}Nb_{2/3})_{0.3}\}O_3$.

The powdery mixture was pre-sintered at 800° C. for 5 hours, and then mixed in a ball mill for 24 hours to give a pre-sintered powder.

Next, the pre-sintered powder was shaped at a uniaxial pressure of 40 MPa and then at a cold-isostatic pressure of 300 MPa for 2 minutes to obtain a shaped body.

Next, the shaped body was embedded in a powder having the same composition as that of the body in a closed MgO container, and heated at 1200° C. for 2 hours to obtain a sintered body.

This sintered body had a single phase having a perovskite-type structure, and its relative density was 97%.

However, as in FIG. 11, the X-ray diffraction pattern of this sintered body did not significantly differ from that of an ordinary perovskite-type-structured compound. This suggests that this sintered body was not oriented.

This Example verifies that the production method of the present invention gives crystal-oriented ceramics.

This Example proves the advantages of the present invention, which are referred to hereinunder.

Figures 12A, 12B, 12C:
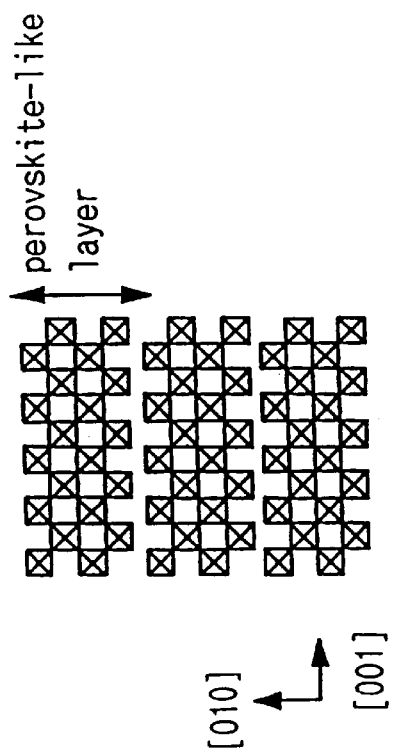
FIG. 12A is a graphic view showing the structure of $Sr_2Nb_2O_7$ referred to in Example 9.
FIG. 12B is a common graphic view showing the {010} plane of the structure of $Sr_2Nb_2O_7$, and the {110} plane of the perovskite-type structure, both referred to in Example 9.
FIG. 12C is a graphic view showing the perovskite-type structure referred to in Example 9.

In this Example, the host material used has the structure of $Sr_2Nb_2O_7$ as in FIG. 12A; and the guest material used has the perovskite-type structure as in FIG. 12C. The elementary arrangement in the {010} plane of the host material is the same as that in the {110} plane of the guest material, as in FIG. 12B, and the two planes have good lattice matching with each other.

The host material and the guest material may be conjugated together via the planes having such good lattice matching to minimize the interface energy therebetween.

Therefore, the additive as applied onto the surfaces of the grains that constitute the host material produces the guest material which is epitaxially growing on the surfaces, and the guest material thus grown is oriented relative to its {110} plane.

In the production method of this Example, the mixture comprising the host material and the additive is tape-cast, using a doctor-blading apparatus, and the host material in the resulting strip is oriented relative to its {010} plane. The thus-shaped strip is thereafter heated, whereupon the guest material existing therein is oriented, as in FIG. 8. As a result of this heat treatment, obtained is a crystal-oriented ceramic in which at least a part of the guest material is oriented.

Figure 9A:
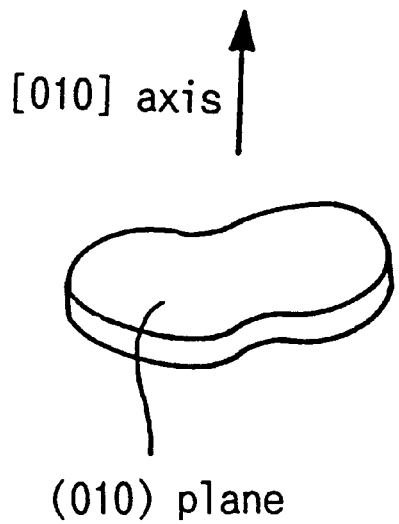
FIG. 9A is a graphic view showing the flaky, morphologically-anisotropic grain that constitutes the host material used in Example 9.
Figure 9B:
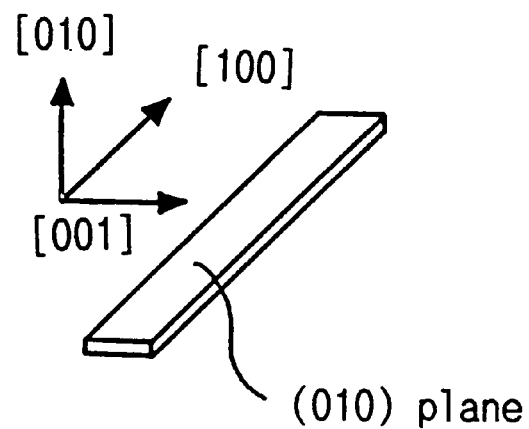
FIG. 9B is a graphic view showing the blade-like, morphologically-anisotropic grain that constitutes the host material used in Example 9, the grain being prolonged in the direction of its [100] axis with its {010} plane being expanded.

In the production method of this Example, used was the host material composed of blade-like, morphologically-anisotropic grains as in FIG. 9B to obtain the crystal-oriented ceramic as in FIG. 8A.

Figure 8B:
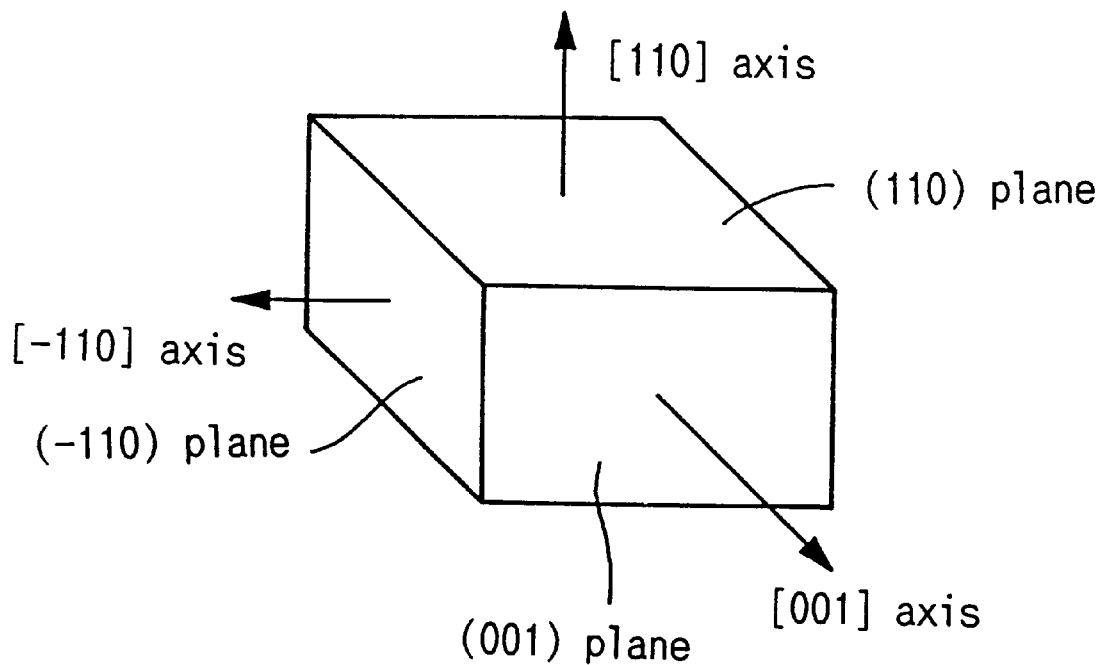
FIG. 8B is a graphic view showing the perovskite-type-structured, crystal-oriented ceramic sample obtained in Example 9, in which the sample is biaxially oriented.

If the same blade-like grains are used and if the mixture is shaped through the combination of extrusion and roll-pressing to give a shaped body in which not only the {010} plane of the host material is oriented but also the morphologically-anisotropic grains of the host material are unified with respect to the direction of the major axis of each grain, a crystal-oriented ceramic having a biaxially-oriented perovskite-type structure can be produced as in FIG. 8B.

EXAMPLE 10

This Example is to demonstrate the production of a crystal-oriented ceramic sample of the invention. In this, the host material used remained little in the finally-obtained, crystal-oriented ceramic product.

The host material used herein is a powder of plate-like grains of layered strontium titanate ($Sr_3Ti_2O_7$) as prepared by mixing powders of strontium carbonate and titanium oxide with powders of sodium chloride and potassium chloride followed by heating the resulting mixture at 1300° C.

The starting material of the guest material used is a mixture of $SrCO_3$ and $TiO_2$.

The guest material produced from the starting material is $SrTiO_3$.

The layered strontium titanate, $SrCO_3$ and $TiO_2$ were weighed to have a molar ratio of $Sr_3Ti_2O_7/SrCO_3/TiO_2=1/1/2$.

These were mixed along with ethanol in a ball mill to give a mixture. This mixture was dried in powder.

The thus-prepared powder was shaped under uniaxial pressure and then under cold-isostatic pressure to give a shaped green body. This green body was heated in an oxygen atmosphere at 1000° C. for 2 hours and then at 1300° C. for further 2 hours to obtain a sintered body.

The surface of the sintered body was polished.

The polished surface of the sample thus obtained was subjected to X-ray diffractometry. The pattern obtained gave no peak for the host material but gave a peak for the single phase of $SrTiO_3$.

The degree of orientation of the sample was measured to be 10% relative to its {100} plane.

EXAMPLE 11

This Example is to demonstrate the production of crystal-oriented ceramic samples of the invention. In this, the host material and other materials were mixed along with an additive having the ability to convert the host material into the guest material. Herein obtained were Samples 11-a to 11-d, and Comparative Sample C11-a.

The powder of plate-like grains of bismuth titanate, $Bi_4Ti_3O_{12}$ produced in Example 1, a powder of fine equiaxial grains of bismuth potassium sodium titanate, $Bi_{0.5}(Na_{0.85}K_{0.15})_{0.5}TiO_3$, which will be referred to hereinunder, and $Bi_2O_3$, $Na_2CO_3$, $K_2CO_3$ and $TiO_2$ were weighed in a molar ratio of $Bi_4Ti_3O_{12}/Bi_{0.5}(Na_{0.85}K_{0.15})_{0.5}TiO_3/Bi_2O_3/Na_2CO_3/K_2CO_3/TiO_2=1/3/1/2.55/0.45/9$.

The molar ratio of the compounds corresponds to an atomic ratio of Bi/Na/K/Ti=1/0.85/0.15/2. The reaction of all these compounds in the ratio shall give the perovskite-type compound of $Bi_{0.5}(Na_{0.85}K_{0.15})_{0.5}TiO_3$.

Precisely, the powder of fine equiaxial grains of bismuth potassium sodium titanate, $Bi_{0.5}(Na_{0.85}K_{0.15})_{0.5}TiO_3$ is the guest material; $Bi_2O_3$, $Na_2CO_3$, $K_2CO_3$ and $TiO_2$ constitute the starting material of the guest material; the powder of plate-like grains of bismuth titanate, $Bi_4Ti_3O_{12}$ is the host material; and $Na_2CO_3$, $K_2CO_3$ and $TiO_2$ constitute the additive that has the ability to convert the host material into the guest material.

Powders of these materials were mixed along with ethanol and toluene added thereto, in a ball mill. A binder of polyvinyl butyral and a plasticizer of dibutyl phthalate were added thereto and further milled to obtain a uniform slurry. This slurry was tape-cast, using a doctor-blading apparatus, into a sheet.

After having been dried at room temperature, 22 strips cut out of the sheet, each having a thickness of about 100 μm were laminated at a pressure of 100 kg/cm2 at 80° C., and the resulting laminate was roll-pressed through twin rollers to have a thickness of about ½ of its original thickness.

The roll-pressed laminate was heated and dewaxed in an oxygen atmosphere at 600° C. or 700° C. for 2 hours. Next, these were sintered in an oxygen atmosphere at 1150° C. for 10 hours under no external pressure. Thus were obtained two samples; one is Sample 11-a (heated at 600° C.), and the other is Sample 11-b (heated at 700° C.).

On the other hand, the same laminate was heated and dewaxed in an oxygen atmosphere at 600° C. or 700° C. for 2 hours. Next, these were compressed at a cold-isostatic pressure of 3000 kg/cm² or 4000 kg/cm², respectively. Next, these were sintered in an oxygen atmosphere at 1150° C. for 10 hours under no external pressure. Thus were obtained two samples; one is Sample 11-c (cold-isostatically compressed under 3000 kg/cm²), and the other is Sample 11-d (cold-isostatically compressed under 4000 kg/cm²).

These samples, 11-a to 11-d were subjected to X-ray diffractometry at their sheet surfaces, whereupon the patterns obtained from these samples all gave peaks for a perovskite-type-structured single phase.

In these samples, the ratio of the diffraction peak, a, at the {100} plane and at the {200} plane of the perovskite-type-structured bismuth potassium sodium titanate, $Bi_{0.5}(Na_{0.85}K_{0.15})_{0.5}TiO_3$ to the diffraction peak, β, at the {110} plane thereof, or that is, the ratio of α/β, was found to be much larger than the ratio α/β in the pattern obtained from a powder of non-oriented bismuth potassium sodium titanate, $Bi_{0.5}(Na_{0.85}K_{0.15})_{0.5}TiO_3$. The crystal planes as referred to herein are expressed for the crystal of bismuth potassium sodium titanate in the form of a pseudo-cubic system.

The degree of crystal orientation of these samples, 11-a to 11-d, relative to their {100} plane, was not smaller than 90% when measured according to the Lotgering method.

Next, these samples, 11-a to 11-d were polished to remove their surface, and then subjected to X-ray diffractometry. Based on the data obtained, the degree of crystal orientation of these polished surfaces, relative to their {100} plane, was obtained to be not smaller than 80% according to the Lotgering method.

Of these samples, 11-a to 11-d, Sample 11-c (this was sintered under no external pressure) had a degree of surface orientation of 93% and a relative density of 96.0%. This Sample 11-c was pelletized into a pellet having a thickness of 0.5 mm and a diameter of 11 mm, and this was subjected to a resonance-antiresonance test to determine its piezoelectric characteristics.

The data obtained in this test were as follows: $K_p$ (planar effect electromechanical coupling coefficient)=0.404. $K_t$ (thickness effect electromechanical coupling coefficient)= 0.472. $d_{31}$ (transverse effect piezoelectric d coefficient)=57.7 pC/N. $g_{31}$ (transverse effect piezoelectric g coefficient)= $11.4 \times 10^{-3}$ Vm/N.

The data of this Sample 11-c were compared with those of a non-oriented comparative sample, 11-a (this was sintered under the same condition as above, and its data will be referred to hereinunder), and it was found that Kp of Sample 11-c was higher than that of C11-a by about 40%, and that $d_{31}$ and $g_{31}$ of the former were higher than those of the latter by about 60%.

The dielectric loss of Sample 11-c was found to be lower than that of Comparative Sample C11-a by about 40%.

This Example thus verifies that the production method of the present invention gives crystal-oriented ceramics having a high degree of orientation and consisting mostly of only the guest material, and that the crystal-oriented ceramics produced by the method of the invention have excellent piezoelectric characteristics and dielectric characteristics. Accordingly, it is known that the crystal-oriented ceramics of the invention are favorable as piezoelectric materials and also as dielectric materials.

Comparative Sample C11-a was prepared in the manner mentioned below.

$Bi_2O_3$, $Na_2CO_3$, $K_2CO_3$ and $TiO_2$ were weighed in an atomic ratio of Bi/Na/K/Ti=1/0.85/0.15/2, and milled along with ethanol in a ball mill.

Next, the resulting mixture was dried, and then heated at 850° C. for 2 hours to obtain a powder of bismuth potassium sodium titanate, $Bi_{0.5}(Na_{0.85}K_{0.15})_{0.5}TiO_3$. This was milled along with ethanol in a ball mill having therein zirconia balls of 3 mm in diameter.

The thus-obtained powder of fine equiaxial grains of bismuth potassium sodium titanate, $Bi_{0.5}(Na_{0.85}K_{0.15})_{0.5}TiO_3$ was compressed at a uniaxial pressure of 200 MPa, and then at a cold-isostatic pressure of 4000 kg/cm².

Next, the thus-shaped green body was sintered in an oxygen atmosphere at 1150° C. for 10 hours under no external pressure. Thus was obtained Comparative Sample C11-a.

The surface of Comparative Sample C11-a was polished and subjected to X-ray diffractometry. It was found that C11-a, though having a relative density of 99.2%, was not oriented.

This non-oriented C11-a was pelletized to give a pellet having a thickness of 0.5 mm and a diameter of 11 mm, and subjected to a resonance-antiresonance test. Its data were as follows: $K_p$=0.295; $K_t$=0.427; $d_{31}$=36.7 pC/N; $g_{31}=7.0 \times 10^{-3}$ Vm/N.

It is known from the above that the mere mixture and shaping of the starting materials could not give a crystal-oriented ceramic. In addition, it is also known that the piezoelectric and dielectric characteristics of the non-oriented ceramic sample were poorer than those of the crystal-oriented ceramic samples of the invention.

EXAMPLE 12

This Example is to demonstrate the production of a crystal-oriented ceramic sample of the invention. In this, the host material and the starting material of the guest material were mixed along with an additive having the ability to convert the host material into the guest material.

The powder of plate-like grains of bismuth titanate, $Bi_4Ti_3O_{12}$ produced in Example 1, and PbO, $Bi_2O_3$, NiO and $TiO_2$ were weighed in a molar ratio of $Bi_4Ti_3O_{12}$/PbO/$Bi_2O_3$/NiO/$TiO_2$=4/30/7/15/33.

The molar ratio of the compounds corresponds to an atomic ratio of Bi/Pb/Ni/Ti=2/2/1/3. The reaction of all these compounds in the ratio shall give a perovskite-type compound of $Pb_{0.5}Bi_{0.5}Ni_{0.25}Ti_{0.75}O_3$.

Precisely, $Pb_{0.5}Bi_{0.5}Ni_{0.25}Ti_{0.75}O_3$ is the guest material, and this is referred to as PBNT.

The powder of plate-like grains of bismuth titanate $Bi_4Ti_3O_{12}$ is the host material; PbO, $Bi_2O_3$, NiO and $TiO_2$ constitute the starting material of the guest material; and PbO, NiO and $TiO_2$ constitute the additive that has the ability to convert the host material into the guest material.

In addition to these, manganese carbonate was added to the system as a dielectric breakdown inhibitor, in an amount of 0.0005 mols, per mol of the intended final product, perovskite-type compound.

Powders of these materials were mixed along with ethanol and toluene added thereto, in a ball mill. A binder of polyvinyl butyral and a plasticizer of dibutyl phthalate were added thereto and further milled to obtain a uniform slurry. This slurry was tape-cast, using a doctor-blading apparatus, into a sheet.

After having been dried at room temperature, 20 strips cut out of the sheet, each having a thickness of about 100 μm were laminated at a pressure of 100 kg/cm2 at 80° C., and the resulting laminate was roll-pressed through twin rollers to have a thickness of about ½ of its original thickness.

The roll-pressed laminate was heated and dewaxed in an oxygen atmosphere at 600° C. for 2 hours. Next, this was sintered in an oxygen atmosphere at 1100° C. for 5 hours under no external pressure.

This sintered sample was polished and then subjected to X-ray diffractometry at its polished surface, whereupon the pattern gave peaks for a tetragonal perovskite-type-structured single phase.

Precisely, the pattern gave high peaks for {100} and {001} planes, and {200} and {002} planes, all being derived from the diffraction at the {100} plane expressed in the form of a pseudo-cubic system. The degree of orientation of the sample was found to be 14%, when measured according to the Lotgering method.

This Example verifies that the production method of the present invention gives crystal-oriented ceramics consisting mostly of only the guest material.

EXAMPLE 13

This Example is to demonstrate the production of a crystal-oriented ceramic sample of the invention. In this, the host material and other materials were mixed along with an additive having the ability to convert the host material into the guest material. Herein obtained were Sample 13 and Comparative Sample C13.

Powders of strontium hydroxide and titanium oxide were mixed with powders of sodium chloride and potassium chloride, and then heated at 1200° C. to obtain a powder of plate-like grains of layered strontium titanate, $Sr_3Ti_2O_7$.

On the other hand, powders of strontium carbonate and titanium oxide were weighed in a ratio of Sr/Ti=1/1, and mixed along with ethanol in a ball mill. After having been dried, the resulting powdery mixture was heated at 1200° C. for 2 hours to obtain a powder of strontium titanate, $SrTiO_3$. This was milled along with ethanol in a ball mill having therein zirconia balls of 3 mm in diameter.

The powder of plate-like grains of layered strontium titanate, $Sr_3Ti_2O_7$, the powder of fine grains of strontium titanate, $SrTiO_3$, and $SrCO_3$ and $TiO_2$ were weighed in a molar ratio of $Sr_3Ti_2O_7/SrTiO_3/SrCO_3/TiO_2=1/6/1/2$.

The thus-weighed powdery materials were mixed along with ethanol and toluene added thereto, for 20 hours in a ball mill. A binder of polyvinyl butyral and a plasticizer of dibutyl phthalate were added thereto and further mixed. The resulting uniform slurry was tape-cast, using a doctor-blading apparatus, into a sheet.

After having been dried at room temperature, 20 strips cut out of the sheet, each having a thickness of about 100 μm were laminated at a pressure of 100 kg/cm2 at 80° C., and the resulting laminate was roll-pressed through twin rollers to have a thickness of about ½ of its original thickness.

The roll-pressed laminate was heated and dewaxed in an oxygen atmosphere at 600° C. for 2 hours. Next, this was compressed at a cold-isostatic pressure of 3000 kg/cm², and then sintered in an oxygen atmosphere at 1350° C. for 10 hours under no external pressure. The sample thus obtained is referred to as Sample 13.

Sample 13 was subjected to X-ray diffractometry at its sheet surface, which proved that Sample 13 had a degree of orientation of 62% relative to its {100} plane and had a single phase of $SrTiO_3$.

After having been surface-polished, Sample 13 was found to have a degree of orientation of 51%.

These data verify that the production method of the present invention gives crystal-oriented ceramics consisting mostly of only the guest material.

Comparative Sample C13 was prepared in the manner mentioned below.

Powders of strontium carbonate and titanium oxide were weighed in a ratio of Sr/Ti=1/1, and mixed along with ethanol in a ball mill. After having been dried, the resulting powdery mixture was heated at 1200° C. for 2 hours to obtain a powder of strontium titanate, $SrTiO_3$. This was milled along with ethanol in a ball mill having therein zirconia balls of 3 mm in diameter.

The powder of fine equiaxial grains of strontium titanate, $SrTiO_3$ was compressed at a uniaxial pressure of 200 MPa and then at a cold-isostatic pressure of 3000 kg/cm². The thus-shaped green body was sintered in an oxygen atmosphere at 1350° C. for 10 hours under no external pressure. Thus was obtained Comparative Sample C13.

Comparative Sample C13 was subjected to X-ray diffractometry, which proved that this was not oriented.

It is known from the above that the mere mixture and shaping of the starting materials could not give a crystal-oriented ceramic.

EXAMPLE 14

This Example is to demonstrate the production of a crystal-oriented ceramic sample of the invention. In this, the host material and other materials were mixed along with an additive having the ability to convert the host material into the guest material. Herein obtained were Sample 14 and Comparative Sample C14.

Powders of calcium carbonate and titanium oxide were mixed with powders of sodium chloride and potassium chloride, and then heated at 1400° C. to obtain a powder of plate-like grains of layered calcium titanate, $Ca_3Ti_2O_7$.

The powder of plate-like grains of layered calcium titanate, $Ca_3Ti_2O_7$, a powder of fine grains of calcium titanate, $CaTiO_3$ as produced according to a solid phase method, and $CaCO_3$ and $TiO_2$ were weighed in a molar ratio of $Ca_3Ti_2O_7/CaTiO_3/CaCO_3/TiO_2=1/6/1/2$.

The thus-weighed powdery materials were mixed along with ethanol and toluene added thereto, for 20 hours in a ball mill. A binder of polyvinyl butyral and a plasticizer of dibutyl phthalate were added thereto and further milled. The resulting uniform slurry was tape-cast, using a doctor-blading apparatus, into a sheet.

After having been dried at room temperature, 20 strips cut out of the sheet, each having a thickness of about 100 μm were laminated at a pressure of 100 kg/cm² at 80° C., and the resulting laminate was roll-pressed through twin rollers to have a thickness of about ½ of its original thickness.

The roll-pressed laminate was heated and dewaxed in an oxygen atmosphere at 600° C. for 2 hours, and then further heated at 1400° C. for 10 hours. The sample thus shaped under no external pressure is referred to as Sample 14.

Sample 14 was surface-polished and then subjected to X-ray diffractometry on its polished surface. In the pattern obtained, no peak for $Ca_3Ti_2O_7$ was seen but only peaks for the single phase of orthorhombic grains of $CaTiO_3$ were seen.

Based on the X-ray diffraction pattern of $CaTiO_3$ powder, the degree of orientation of Sample 14 relative to its {100} plane as expressed in the form of a pseudo-cubic system was obtained to be 50%.

These data verify that the production method of the present invention gives crystal-oriented ceramics consisting mostly of only the guest material.

Comparative Sample C14 was prepared in the manner mentioned below.

Powders of calcium carbonate and titanium oxide were weighed in a ratio of $CaCO_3/TiO_2=1/1$, mixed along with ethanol in a ball mill, and then heated at 1200° C. The resulting powder was further milled along with ethanol in a ball mill having therein zirconia balls of 3 mm in diameter.

The thus-obtained powder was compressed at a uniaxial pressure of 200 MPa and then at a cold-isostatic pressure of 3000 kg/cm². The resulting green body was sintered in an oxygen atmosphere at 1400° C. for 5 hours under no external pressure. Thus was obtained Comparative Sample C14.

Comparative Sample C14 was surface-polished and then subjected to X-ray diffractometry on its polished surface. The pattern gave peaks for the single phase of orthorhombic grains of $CaTiO_3$, but no crystal orientation was found in Sample C14.

It is known from the above that the mere mixture and shaping of the starting materials could not give a crystal-oriented ceramic.

EXAMPLE 15

This Example is to demonstrate the production of a crystal-oriented ceramic substrate of polycrystalline $Bi_{0.5}Na_{0.5}TiO_3$, which is oriented predominantly relative to its {100} plane as expressed in the form of a pseudo-cubic system. The degree of Lotgering orientation of the substrate is not smaller than 20%.

This Example further demonstrates the production of a device comprising the substrate, in which a functional thin film of $Pb(Zr_{0.53}Ti_{0.47})O_3$ is formed on the surface of the substrate. This device is usable as a non-volatile memory device.

The method of producing the crystal-oriented ceramic substrate is referred to hereinunder.

A host material of plate-like grains of $Bi_4Ti_3O_{12}$, and $Bi_{0.5}Na_{0.5}TiO_3$, $Bi_2O_3$, $TiO_2$ and $Na_2CO_3$ were weighed in a molar ratio of 1/3/1/9/3.

These were mixed along with toluene and ethanol added thereto, in a ball mill for 20 hours to obtain a slurry.

This slurry was further mixed along with a binder and a plasticizer added thereto, for further 1 hour. The resulting mixture was tape-cast, using a doctor-blading apparatus, into a sheet.

A plurality of these strips cut out of the sheet, were laminated under pressure, and roll-pressed to obtain a laminate plate.

The laminate plate was heated and dewaxed at 700° C., and then shaped through CIP (at 4000 kg/cm$^2$). The resulting green plate was sintered at 1150° C. for 10 hours to obtain a sintered plate of $Bi_{0.5}Na_{0.5}Ti$, which had a relative density of 98% and was oriented to have a degree of orientation of 95% relative to the {100} plane as expressed in the form of a pseudo-cubic system. After having been surface-polished, this had a degree of orientation of 90% relative to the same crystal plane.

As a result of the above-mentioned process, obtained was a crystal-oriented ceramic plate of BNT.

An epitaxial thin film of $LaNiO_3$ having a thickness of 300 nm was formed on the BNT substrate through laser ablation or sol-gel deposition.

Next, a functional thin film of $Pb(Zr_{0.53}Ti_{0.47})O_3$ was formed over the epitaxial thin film through sol-gel deposition.

The functional thin film had a degree of orientation of about 90%, in which the {100} plane as expressed in the form of a pseudo-cubic system was oriented in the degree.

The functional thin film was found to have a degree of spontaneous polarization of 35 $\mu C/cm^2$, and the structure thus produced herein was usable as an element in non-volatile memory devices.

This Example proves the advantages of the present invention, which are referred to hereinunder.

The crystal-oriented ceramic substrate produced in this Example is a polycrystalline substrate in which the crystals constituting it were oriented. The degree of Lotgering orientation of the substrate is not smaller than 20%.

Therefore, a functional thin film can be formed on the crystal-oriented ceramic substrate, with its crystal axis being oriented relative to the crystal lattice of the substrate. Precisely, the functional thin film formed on the surface of the crystal-oriented ceramic substrate is oriented at least to the same degree of orientation as that of the substrate.

In addition, since the crystal-oriented ceramic substrate produced herein is a polycrystalline one, the production costs for producing it are lower than those for producing single-crystalline substrates. Moreover, it is easy to enlarge the surface area of the crystal-oriented ceramic substrate of the invention. Therefore, it is also easy to produce large-size devices, using the substrate of the invention.

Moreover, the crystallization temperature at which the functional thin film is formed on the crystal-oriented ceramic substrate of the invention may be lower than that at which the same film is formed on single-crystalline substrates. Therefore, the degree of orientation of the functional thin film formed on the substrate of the invention can be increased, thereby giving an excellent device.

The crystal-oriented ceramic substrate used in this Example is a polycrystalline BNT substrate, of which the mechanical strength is higher than that of a single-crystalline oxide substrate, and of which the heat resistance is higher than that of a semiconductor substrate such as an Si substrate.

As has been demonstrated in this Example, it is easy, according to the present invention, to provide a low-priced and large-sized, crystal-oriented ceramic substrate, on which can be formed a functional thin film having a high degree of orientation to give an excellent device.

EXAMPLE 16

This Example is to demonstrate the production of a device, which is usable as a superconductive electronic device.

The device of this Example comprises a functional thin film of $YBa_2Cu_3O_7$-a as formed on a crystal-oriented ceramic substrate of $SrTiO_3$.

The method of producing the crystal-oriented ceramic substrate is referred to hereinunder.

Plate-like grains of $Sr_3Ti_2O_7$, and $TiO_2$ were weighed in a molar ratio of 1/1.

These were mixed along with toluene and ethanol added thereto, in a ball mill for 20 hours to give a slurry.

This slurry was subjected to tape-casting, roll-pressing, dewaxing and CIPing to give a sample plate, in the same manner as in Example 15. This sample plate was sintered at 1400° C. for 10 hours to obtain a sintered body of $SrTiO_3$, which had a relative density of 98% and had a degree of orientation of 85% relative to its pseudo-cubic {100} plane. After having been surface-polished, this had a degree of orientation of 80% relative to the same plane. As a result of this process, obtained herein was a crystal-oriented ceramic substrate of ST.

A functional thin film of $YBa_2Cu_3O_7$-a was formed on the ST substrate through laser ablation to give a device.

This device was subjected to X-ray diffractometry, which proved strong C-axis orientation of the device.

This device is usable as a superconductive electronic device.

Different variations of the oriented ceramic substrate of $SrTiO_3$ produced hereinabove are referred to hereinunder, in which the starting materials to be used are varied.

Plate-like grains of $Sr_3Ti_2O_7$, and $SrTiO_3$ and $TiO_2$ were mixed in a molar ratio of 3/11/3. The resulting mixture was processed in the same manner as above to produce an oriented ceramic substrate.

Plate-like grains of $Sr_3Ti_2O_7$, and $SrTiO_3$, $SrCO_3$ and $TiO_2$ were mixed in a molar ratio of 1/3/4/5. The resulting mixture was processed in the same manner as above to produce an oriented ceramic substrate.

The degree of orientation of these oriented ceramic substrates was 62% and 53%, respectively, relative to the pseudo-cubic {100} plane.

The others than the above were the same as those in Example 15.

As being oriented, the devices produced in this Example exhibit a superconductive effect in the direction parallel to the oriented crystal plane of the substrate. The other advantages of the devices produced herein are the same as those in Example 15.

EXAMPLE 17

This Example is to demonstrate the production of a device having a thin, functional pyroelectric film as formed on the ST substrate produced in Example 16.

Precisely, a thin film of $LaNiO_3$ having a thickness of 200 nm was formed on the ST substrate through sol-gel deposition. In addition, a thin, functional pyroelectric film of $(Pb,La)TiO_3$ was formed over the $LaNiO_3$ film.

The functional thin film was found to be strongly oriented relative to the C-axis, and the device produced herein is usable as a pyroelectric sensor device.

The others than the above were the same as those in Example 16.

As having the oriented, functional thin film, the device produced herein has a higher pyroelectric factor than a device having a non-oriented, thin film, and therefore has a higher quality factor than the latter. The other advantages of the device produced herein are the same as those in Example 16.

EXAMPLE 18

This Example is to demonstrate the production of crystal-oriented ceramic samples having a single phase of a guest material only, in which are used a host material, a guest material and an additive.

A mixture of $Bi_2O_3$, $Na_2CO_3$, $K_2CO_3$ and $TiO_2$, all weighed in a ratio of Bi/Na/K/Ti=1/0.85/0.15/2, was heated at 850° C. for 2 hours to give a powder of bismuth potassium sodium titanate, $Bi_{0.5}(Na_{0.85}K_{0.15})_{0.5}TiO_3$.

The compound powder was mixed along with ethanol in a ball mill having therein zirconia balls of 3 mm in diameter, thereby to give a powder of equiaxial grains of bismuth potassium sodium titanate, $Bi_{0.5}(Na_{0.85}K_{0.15})_{0.5}TiO_3$.

The powder of plate-like grains of bismuth titanate, $Bi_4Ti_3O_{12}$ produced in Example 1, the powder of fine equiaxial grains of bismuth potassium sodium titanate, $Bi_{0.5}(Na_{0.85}K_{0.15})_{0.5}TiO_3$ prepared hereinabove, and $Na_2CO_3$, $K_2CO_3$ and $TiO_2$ were weighed in a molar ratio of $Bi_4Ti_3O_{12}/Bi_{0.5}(Na_{0.85}K_{0.15})_{0.5}TiO_3/Na_2CO_3/K_2CO_3/TiO_2$=1/7/1.7/0.3/5.

The molar ratio of the compounds corresponds to an atomic ratio of Bi/Na/K/Ti=1/0.85/0.15/2. The reaction of all these compounds in the ratio shall give the perovskite-type compound of $Bi_{0.5}(Na_{0.85}K_{0.15})_{0.5}TiO_3$.

Precisely, the powder of fine equiaxial grains of bismuth potassium sodium titanate, $Bi_{0.5}(Na_{0.85}K_{0.15})_{0.5}TiO_3$ is the guest material; the powder of plate-like grains of bismuth titanate, $Bi_4Ti_3O_{12}$ is the host material; and $Na_2CO_3$, $K_2CO_3$ and $TiO_2$ constitute the additive that has the ability to convert the host material into the guest material.

In addition to the above-mentioned host material, guest material and additive, manganese carbonate was added to the system as a dielectric breakdown inhibitor, in an amount of 0.0005 mols per mol of the intended final product, perovskite-type compound (crystal-oriented ceramic).

Powders of these materials were mixed along with ethanol and toluene added thereto, in a ball mill. A binder of polyvinyl butyral and a plasticizer of dibutyl phthalate were added thereto and further mixed to obtain a uniform slurry. This slurry was tape-cast, using a doctor-blading apparatus, into a sheet.

These strips cut out of the sheet, were dried at room temperature to have a thickness of about 100 μm.

These 22 strips were laminated at a pressure of 100 kg/cm2 at 80° C., and the resulting laminate was roll-pressed through twin rollers to have a thickness of about ½ of its original thickness. The roll-pressed laminate was heated and dewaxed in an oxygen atmosphere at 600° C. or 700° C. for 2 hours. Next, these were sintered in an oxygen atmosphere at 1200° C. for 5 hours under no external pressure.

Thus were obtained crystal-oriented ceramic samples.

On the other hand, the same dewaxed laminate was compressed at a cold-isostatic pressure of 4000 $kg/cm^2$, and then sintered in an oxygen atmosphere at 1200° C. for 5 hours under no external pressure.

Thus were obtained other crystal-oriented ceramic samples.

Figure 13:
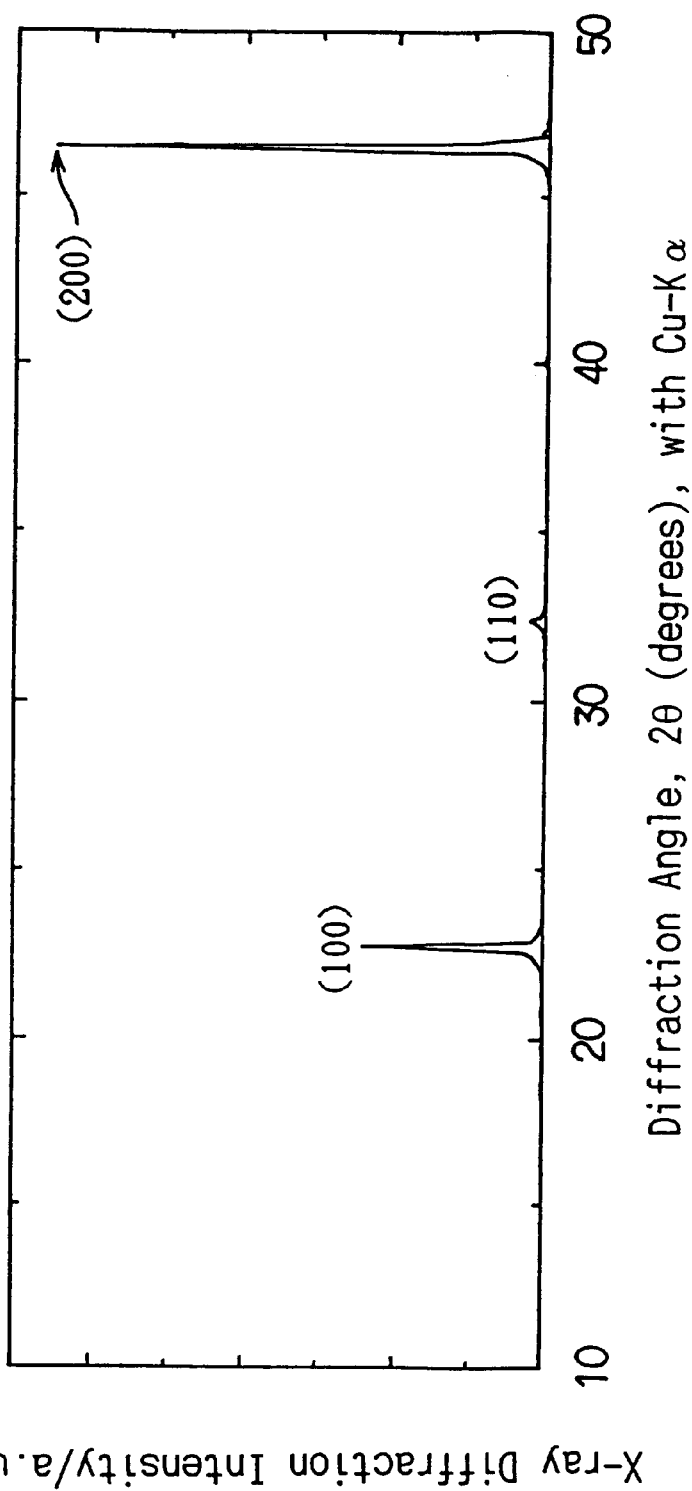
FIG. 13 shows an X-ray diffraction pattern of the crystal-oriented ceramic sample of the present invention obtained in Example 18.

These samples were subjected to X-ray diffractometry on their surfaces, which gave the pattern shown in FIG. 13. In this pattern, seen are peaks for the single phase having a perovskite-type structure.

Figure 14:
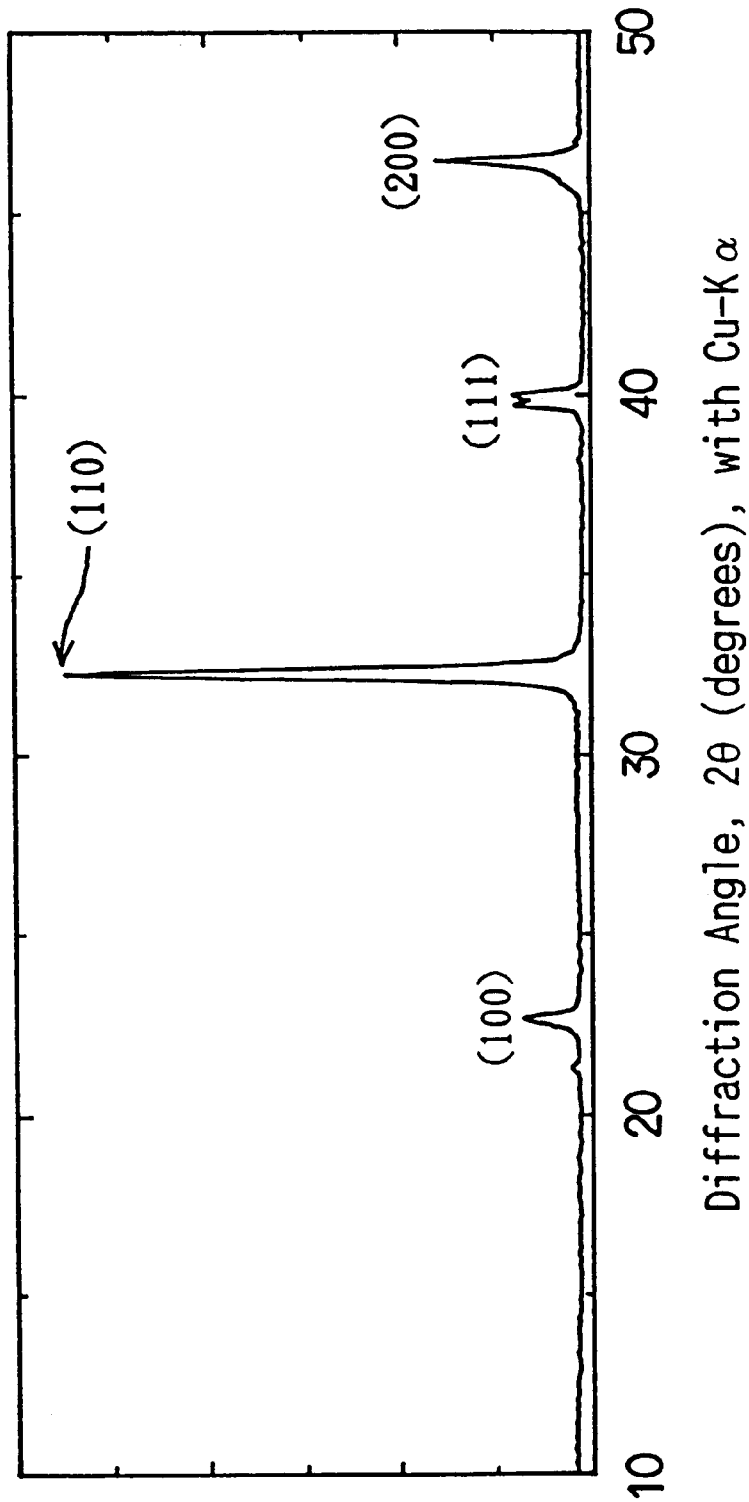
FIG. 14 shows an X-ray diffraction pattern of the non-oriented, polycrystalline oxide ceramic sample prepared in Example 18 as a comparative sample.

The ratio of the diffraction peak, $\alpha$, at the (100) plane and at the (200) plane of the perovskite-type-structured bismuth potassium sodium titanate, $Bi_{0.5}(Na_{0.85}K_{0.15})_{0.5}TiO_3$ to the diffraction peak, $\beta$, at the (110) plane thereof, or that is, the ratio of the was found to be much larger than the ratio $\alpha/\beta$ in the pattern from a powder of non-oriented bismuth potassium sodium titanate, $Bi_{0.5}(Na_{0.85}K_{0.15})_{0.5}TiO_3$ (see FIG. 14 to be mentioned hereinunder). The crystal planes as referred to herein are expressed for the crystal of bismuth potassium sodium titanate in the form of a pseudo-cubic system.

The degree of crystal orientation of these samples relative to their {100} plane was found to be not smaller than 95% when measured according to the Lotgering method.

Figure 15:
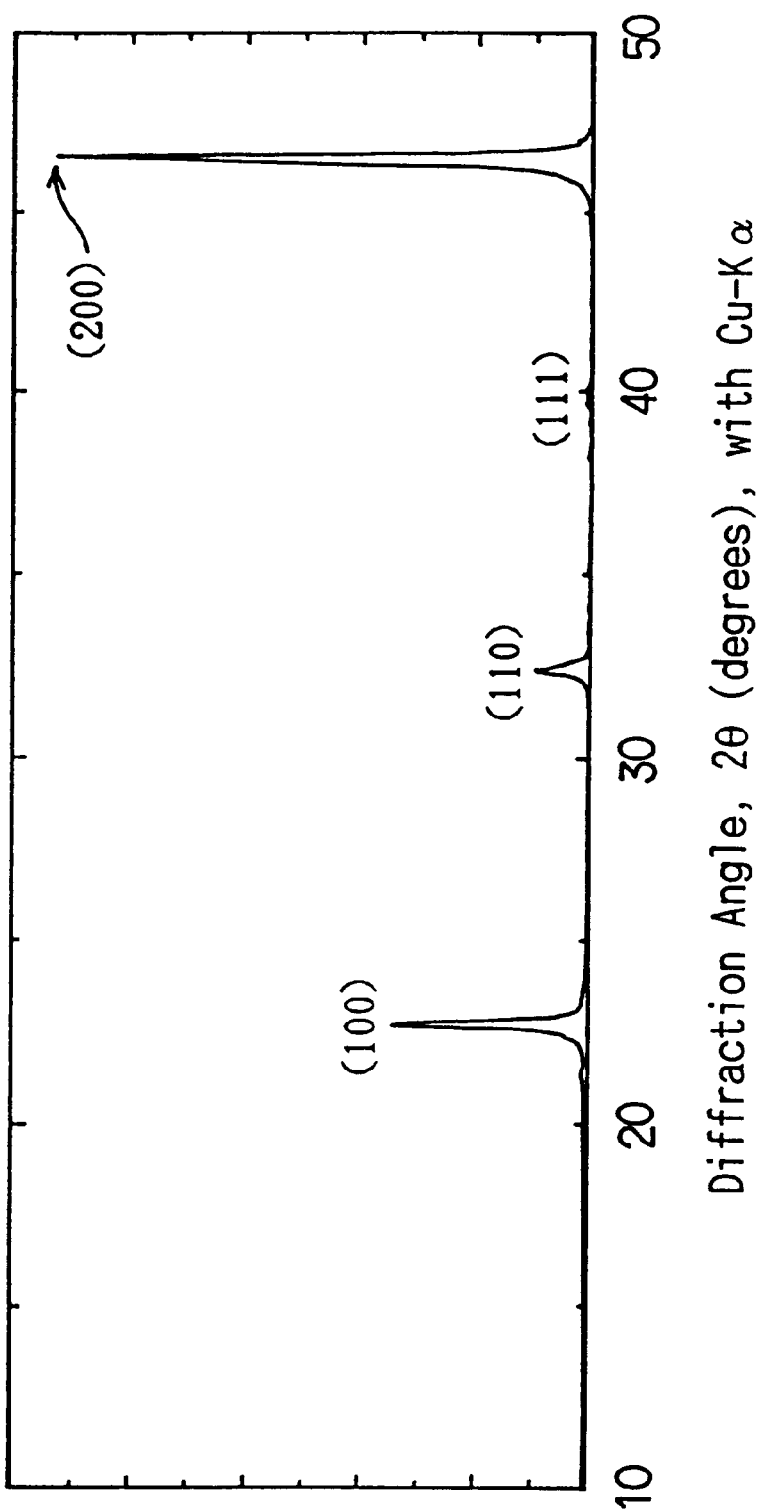
FIG. 15 shows an X-ray diffraction pattern of the surface-polished, crystal-oriented ceramic sample of the present invention obtained in Example 18.

Next, these samples were polished to remove their surface, and then subjected to X-ray diffractometry. As in FIG. 15, the degree of Lotgering orientation of these polished samples, relative to their {100} plane, was found to be not smaller than 85%.

Of the se samples, one had a degree of surface crystal orientation of 98% and a relative density of 98.1%. This sample was pelletized into a pellet having a thickness of 0.5 mm and a diameter of 11 mm, and this was subjected to a resonance-antiresonance test to determine its piezoelectric characteristics. The data obtained in this test were as follows: $K_p$ (planar effect electromechanical coupling coefficient)=0.403. $K_t$ (thickness effect electromechanical coupling coefficient)=0.444. $d_{31}$ (transverse effect piezoelectric d coefficient)=59.1 pC/N.

The data of this crystal-oriented ceramic pellet sample were compared with those of a non-oriented comparative sample (this has almost the same composition as the oriented sample and was sintered under the same condition as above, and its data will be referred to hereinunder), and it was found that $K_p$ of the oriented sample was higher than that of the non-oriented comparative sample by about 40%, and that $d_{31}$ of the former was higher than that of the latter by about 60%.

This Example thus verifies that the production method of the present invention gives crystal-oriented ceramics having a high degree of crystal orientation and consisting mostly of only the guest material, and that the crystal-oriented ceramics produced by the method of the invention have excellent piezoelectric characteristics and dielectric characteristics.

The comparative non-oriented sample was prepared in the manner mentioned below.

$Bi_2O_3$, $Na_2CO_3$, $K_2CO_3$ and $TiO_2$ were weighed in an atomic ratio of Bi/Na/K/Ti=1/0.85/0.15/2, to which was added a dielectric breakdown inhibitor of manganese carbonate in an amount of 0.0005 mols per mol of the intended final product, perovskite-type compound.

These were mixed along with ethanol in a ball mill.

The resulting mixture was dried, and then heated at 850° C. for 2 hours to obtain a powder of bismuth potassium sodium titanate, $Bi_{0.5}(Na_{0.85}K_{0.15})_{0.5}TiO_3$. This was milled along with ethanol in a ball mill having therein zirconia balls of 3 mm in diameter.

Thus was obtained a powder of fine equiaxial grains of bismuth potassium sodium titanate, $Bi_{0.5}(Na_{0.85}K_{0.15})_{0.5}TiO_3$.

This powder was compressed at a uniaxial pressure of 200 MPa, and then at a cold-isostatic pressure of 4000 kg/cm$^2$.

Next, the thus-shaped green body was sintered in an oxygen atmosphere at 1200° C. for 5 hours under no external pressure.

The surface of the comparative sample thus obtained was polished and subjected to X-ray diffractometry, which gave the pattern shown in FIG. 14. From this pattern, it is known that this comparative sample is a non-oriented ceramic. This comparative sample was found to have a relative density of 99.0%.

This non-oriented comparative sample was pelletized to give a pellet having a thickness of 0.5 mm and a diameter of 11 mm, and subjected to a resonance-antiresonance test to determine its piezoelectric characteristics. Its data were as follows: $K_p$=0.289; $K_t$=0.398; $d_{31}$=37.1 pC/N.

It is known from the above that the mere mixture and shaping of the starting materials could not give a crystal-oriented ceramic. In addition, it is also known that the piezoelectric characteristics of the non-oriented ceramic sample were poorer than those of the crystal-oriented ceramic samples of the invention.

EXAMPLE 19

This Example is to demonstrate the production of an Sr-containing, crystal-oriented ceramic sample of the invention.

Powders of strontium carbonate and titanium oxide were weighed in a ratio of Sr/Ti=1/1, milled along with ethanol in a ball mill, and dried.

The resulting powdery mixture was heated at 1300° C. for 2 hours to obtain a powder of strontium titanate, $SrTiO_3$. The resulting powdery compound was milled along with ethanol in a ball mill having therein zirconia balls of 3 mm in diameter.

Next, the powder of plate-like grains of layered strontium titanate, $Sr_3Ti_2O_7$ produced in Example 3, the fine powder of strontium titanate, $SrTiO_3$ prepared above, and $TiO_2$ were weighed in a molar ratio of $Sr_3Ti_2O_7/SrTiO_3/TiO_2$=3/11/3.

In this, the layered strontium titanate $Sr_3Ti_2O_7$ is the host material, and strontium titanate $SrTiO_3$ is an additive.

These materials were mixed, tape-cast, laminated under pressure and roll-pressed in the same manner as in Example 13 to obtain a shaped green body.

The resulting green body was heated and dewaxed in an oxygen atmosphere at 600° C. for 2 hours, and thereafter sintered in an oxygen atmosphere at 1350° C. for 10 hours under no external pressure. Thus was obtained a crystal oriented ceramic sample.

The thus-obtained sample was subjected to X-ray diffractometry on its surface, which proved that the sample had a single phase of $SrTiO_3$ having a degree of crystal orientation of 62% relative to its {100} plane.

This Example verifies that the production method of the present invention gives crystal-oriented ceramics having a high degree of crystal orientation. In this, the host material was, after having been reacted with the additive, converted into the guest material, and remained little in the crystal-oriented ceramic sample obtained.

EXAMPLE 20

This Example is to demonstrate the production of a Ca-containing, crystal-oriented ceramic sample of the invention.

Powders of calcium carbonate and titanium oxide were mixed with powders of sodium chloride and potassium chloride, and then heated at 1400° C. to give a powder or plate-like grains of layered calcium titanate, $Ca_3Ti_2O_7$.

The powder of plate-like grains of layered calcium titanate, $Ca_3Ti_2O_7$ prepared above, a fine powder of calcium titanate, $CaTiO_3$ as prepared in a solid phase, and $TiO_2$ were weighed in a molar ratio of $Ca_3Ti_2O_7/CaTiO_3/TiO_2$=1/7/1.

In this, the layered calcium titanate $Ca_3Ti_2O_7$ is the host material, and calcium titanate $CaTiO_3$ is the guest material and $TiO_2$ constitute an additive.

These three materials were mixed along with a mixed solvent of ethanol and toluene in a ball mill, to which were added a binder and a plasticizer. The resulting mixture was further milled in a ball mill, and then tape-cast, using a doctor-blading apparatus, into a sheet having a thickness of about 100 $\mu$m.

These 20 strips cut out of the sheet, were laminated under pressure, and roll-pressed through twin rollers into a laminate strip having a thickness of about 1 mm.

Next, this was dewaxed in an oxygen atmosphere at 600° C. for 1 hour, and then heated at 1400° C. for 10 hours. Thus was obtained a crystal-oriented ceramic s ample.

After having been surface-polished, the sample was subjected to X-ray diffractometry. In the pattern obtained, no peak for $Ca_3Ti_2O_7$ was seen, but peaks for the single phase of orthorhombic crystals of CaTiO were seen.

Based on the X-ray diffraction pattern of $CaTiO_3$ powder which is synthesized by a solid-phase reaction of $CaCO_3$ with $TiO_2$, the degree of orientation of the sample prepared herein, relative to its {100} plane as expressed in the form of a pseudo-cubic system, was obtained to be 60%.

These data verify that the production method of the present invention gives crystal-oriented ceramics having a high degree of crystal orientation. In this, the host material was, after having been reacted with the additive, converted into the guest material, and remained little in the crystal-oriented ceramic sample obtained.

EXAMPLE 21

Figure 16:
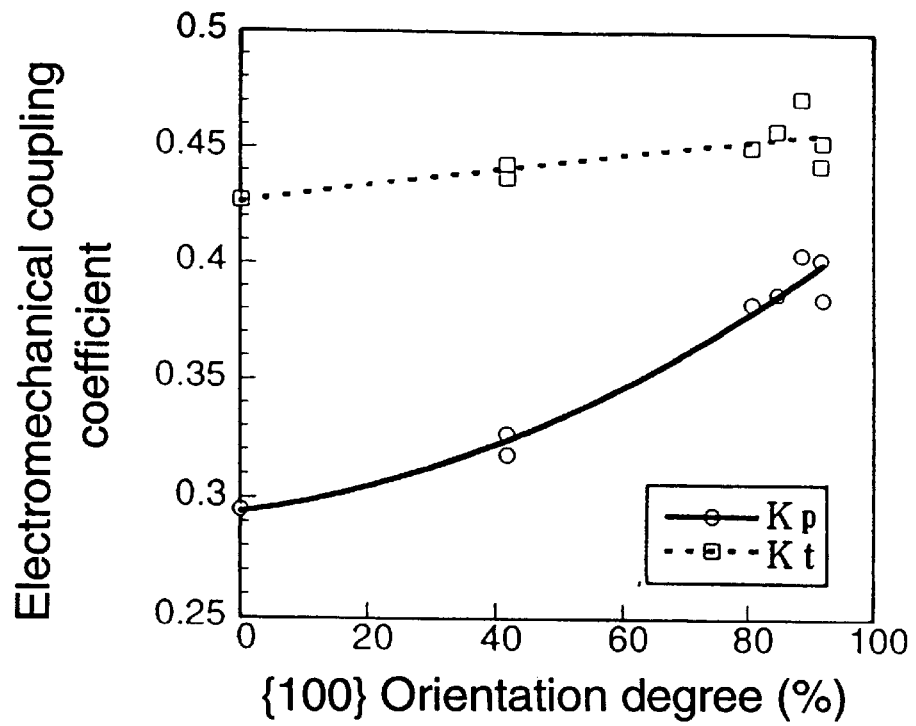
FIG. 16 is a graph showing the relationship between {100} orientation degree, and Kt and Kp for $Bi_{0.5}(Na_{0.85}K_{0.15})_{0.5}TiO_3$ in Example 21.
Figure 17:
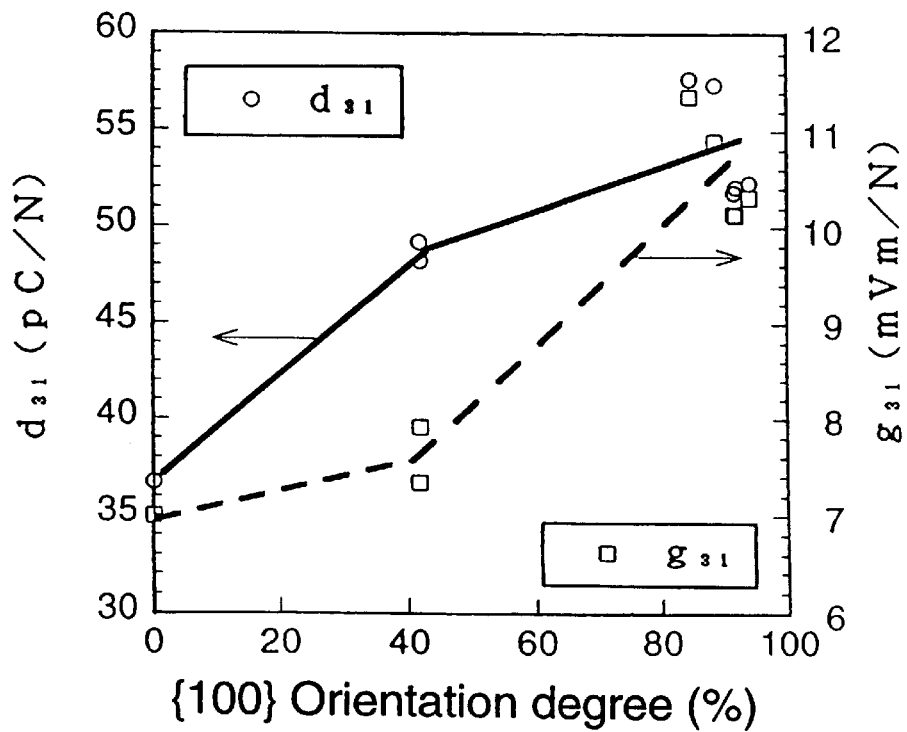
FIG. 17 is a graph showing the relationship between {100} orientation degree, and $d_{31}$ and $g_{31}$ for $Bi_{0.5}(Na_{0.85}K_{0.15})_{0.5}TiO_3$ in Example 21.

Crystal-oriented and randomly-oriented bismuth sodium potassium titanium oxide, $Bi_{0.5}(Na_{0.85}K_{0.15})_{0.5}TiO_3$, were fabricated from different raw material batch and through several different processing conditions and sintered at 1150° C. for 10 hours. The surface of the sintered ceramic specimens was polished and X-ray diffraction patterns were obtained. All the specimens were found to be a rhombohedral morphotropic phase. The {100} orientation degree of the specimen and piezoelectric properties are given in FIGS. 16 and 17. It was found that the Kp, Kt, $d_{31}$ and $g_{31}$ values were increased as the increased orientation degree of {100}. The Kp, $d_{31}$ and $g_{31}$ values were especially increased as the increased orientation degree of {100}.

EXAMPLE 22

Piezoelectric $Bi_{0.5}Na_{0.5}TiO_3$-related ceramics with crystal orientation and random orientation were fabricated through a similar method to the Example 11 and C11. Kp values of the crystal-oriented specimens were compared with Kp values of the randomly-oriented specimens with the same composition and the results were listed in Table 1. The compositions of the piezoelectric ceramics containing $Bi_{0.5}Na_{0.5}TiO_3$ were expressed as $x(ABO_3)+(1-x)(Bi_{0.5}Na_{0.5}TiO_3)$, where the x value and the composition of $ABO_3$ were shown in the Table 1.

Crystal-oriented piezoelectric ceramics exhibited higher Kp values than the randomly-oriented piezoelectric ceramics with the same composition. They are suitable for devices utilizing the planar piezoelectric effect.

crystal orientation of not smaller than 30% as measured according to the Lotgering method wherein at least a part of said oxide is oriented relative to the {100} plane of perovskite-type structure as expressed in the form of a pseudo-cubic system, and at least a part of said oxide contains a rhombohedral morphotropic phase with piezoelectric properties.

3. The crystal-oriented piezoelectric ceramic as claimed in claim 2, wherein said oxide is a solid solution containing $Bi_{0.5}Na_{0.5}TiO_3$ as one of components.

4. A crystal-oriented ceramic comprising an isotropic perovskite-type-structured oxide and having a degree of crystal orientation of not smaller than 10% as measured according to the Lotgering method, wherein at least a part of said oxide is oriented relative to the {110} plane of the perovskite-type structure as expressed in the form of a pseudo-cubic system.

5. A crystal-oriented ceramic comprising an isotropic perovskite-type-structured oxide and having a degree of crystal orientation of not smaller than 10% as measured according to the Lotgering method, wherein at least a part of said oxide is oriented relative to the {111} plane of the perovskite-type structure as expressed in the form of a pseudo-cubic system.

TABLE 1

| Composition of $ABO_3$ | x value | Additive[1] Species | Amount (mol)[2] | Crystal-oriented Orientation degree | Kp | Randomly-oriented Kp |
|---|---|---|---|---|---|---|
| None | 0 | — | — | 80% | 0.201 | 0.153 |
| None | 0 | La | 0.005 | 75% | 0.186 | 0.137 |
| None | 0 | Nd | 0.005 | 77% | 0.194 | 0.142 |
| $Bi_{0.5}K_{0.5}TiO_3$ | 0.13 | — | — | 93% | 0.384 | 0.351 |
| $Bi_{0.5}K_{0.5}TiO_3$ | 0.15 | — | — | 89% | 0.404 | 0.295 |
| $Bi_{0.5}K_{0.5}TiO_3$ | 0.15 | Mn | 0.0005 | 90% | 0.403 | 0.289 |
| $Bi_{0.5}K_{0.5}TiO_3$ | 0.2 | — | — | 86% | 0.386 | 0.278 |
| $BaTiO_3$ | 0.06 | — | — | 78% | 0.365 | 0.257 |
| $BaTiO_3$ | 0.08 | — | — | 74% | 0.378 | 0.262 |
| $PbTiO_3$ | 0.15 | — | — | 74% | 0.384 | 0.268 |
| $SrTiO_3$ | 0.22 | — | — | 75% | 0.164 | 0.102 |
| $CaTiO_3$ | 0.06 | — | — | 88% | 0.177 | 0.118 |
| $NaNbO_3$ | 0.07 | — | — | 81% | 0.162 | 0.112 |
| $KNbo_3$ | 0.08 | — | — | 89% | 0.183 | 0.129 |
| $PbTiO_3$ | 0.1 | — | — | 77% | 0.286 | 0.213 |
| $NaNbO_3$ | 0.05 | — | — | 77% | 0.286 | 0.213 |

[1] The additives were given as carbonates or oxides.
[2] A molar amount added to one mole of the piezoelectric ceramic.

Although the present invention has been described with reference to specific exemplary embodiments, it will be appreciated by those skilled in the art that various modifications and alterations can be made to the particular embodiments shown without materially departing from the novel teachings and advantages of the present invention. Accordingly, it is to be understood that all such modifications and alterations are included within the spirit and scope of the present invention as defined by the following claims.

What is claimed is:

1. A crystal-oriented ceramic comprising an isotropic perovskite-type-structured oxide and having a degree of crystal orientation of not smaller than 10% as measured according to the Lotgering method wherein at least a part of said oxide is oriented relative to the {100} plane of the perovskite-type structure as expressed in the form of a pseudo-cubic system and contains at least one element of Bi, Sr and Ca.

2. A crystal-oriented ceramic comprising an isotropic perovskite-type-structured oxide and having a degree of 6. A method for producing a crystal-oriented ceramic comprising the steps of:
applying a raw material capable of forming an isotropic perovskite-type-structured guest material to a seed crystal of a host material having morphological anisotropy,
converting the raw material into an isotropic perovskite-type-structured guest material, whereby said isotropic perovskite-type-structured guest material forms on the surface and/or in the inside of the seed crystal of the host material having morphological anisotropy, from the raw material capable of forming the guest material having an isotropic perovskite-type-structure; and
orienting at least a part of a crystal plane or axis of said isotropic perovskite-type-structured guest material in accordance with the orientation of a crystal plane or axis of said host material;
wherein said crystal-oriented ceramic comprises an isotropic perovskite-type structured oxide having a degree of crystal orientation of not smaller than 10% as measured according to the Lotgering method.

7. A method for producing a crystal-oriented ceramic comprising the steps of:

applying a guest material having an isotropic perovskite-type-structure to a seed crystal of a host material; and orienting at least a part of a crystal plane or axis of the guest material having an isotropic perovskite-type-structure in accordance with the orientation of a crystal plane or axis of seed crystals of the host material having morphological anisotropy;

wherein said crystal-oriented ceramic comprises an isotropic perovskite-type structured oxide having a degree of crystal orientation of not smaller than 10% as measured according to the Lotgering method.

8. A method for producing a crystal-oriented ceramic comprising the steps of:

mixing a host material with a raw material capable of forming a guest material and/or an isotropic perovskite-type structured guest material to give a mixture;

orienting a crystal plane or axis of the host material in said mixture; and heating said mixture to form and orient the guest material in accordance with a crystal plane or axis of the host material, wherein said crystal-oriented ceramic comprises an isotropic perovskite-type structured oxide having a degree of crystal orientation of not smaller than 10% as measured according to the Lotgering method.

9. The method for producing a crystal-oriented ceramic as claimed in claim 4, further comprising a conversion step of converting said host material into said guest material in the presence of an additive having the ability to convert the host material into the guest material.

10. A method for producing a crystal-oriented ceramic comprising the steps of:

mixing a host material having morphological anisotropy, a raw material capable of producing a guest material having an isotropic perovskite-type structure and/or an isotropic perovskite-type-structured guest material, and an additive having the ability to convert said host material into said guest material or into at least one other guest material having an isotropic perovskite-type structure;

orienting a crystal plane or axis of said host material to obtain a primary oriented body; and heating and sintering said primary oriented body to obtain said crystal-oriented ceramic, wherein said crystal-oriented ceramic comprises an isotropic perovskite-type structured oxide having a degree of crystal orientation of not smaller than 10% as measured according to the Lotgering method.

11. The method for producing a crystal-oriented ceramic as claimed in claim 6 or 8, wherein said host material is a particulate composite ceramic having, on at least one part of its surface, the isotropic perovskite-type-structured guest material epitaxially formed thereon in advance.

12. A method for producing a crystal-oriented ceramic comprising the steps of:

mixing a host material having morphological anisotropy and an additive having the ability to convert said host material into a material having an isotropic perovskite-type structure;

orienting a crystal plane or axis of said host material to obtain a primary oriented body; and heating and sintering said primary oriented body to obtain said crystal-oriented ceramic, wherein said crystal-oriented ceramic comprises an isotropic perovskite-type-structured oxide having a degree of crystal orientation of not smaller than 10% as measured according to the Lotgering method, and at least one crystal plane of the host material has lattice conformity, or lattice matching with at least one crystal plane of the isotropic perovskite-type structure.

13. The method for producing a crystal-oriented ceramic as claimed in any one of claims 8, 10, or 12, wherein said host material has a layered perovskite-type structure.

14. The method for producing a crystal-oriented ceramic as claimed in claim 10 or 12, wherein at least a part of the isotropic perovskite-type-structured oxide is oriented relative to the {110} plane of the perovskite-type structure and said host material has a structure of $Sr_2Nb_2O_7$.

15. The method for producing a crystal-oriented ceramic as claimed in claim 10 or 12, wherein at least a part of the isotropic perovskite-type-structured oxide is oriented relative to the {111} plane of the perovskite-type structure wherein said host material has a magnetoplumbite-type structure-associated crystal structure.

16. A device comprising:

a substrate of a crystal-oriented ceramic of claim 1; and a functional thin film of an isotropic perovskite-type-structured or a layered perovskite-type-structured polycrystalline compound disposed on the substrate.

17. The device as claimed in claim 16, wherein the substrate made of poly-crystals has at least one crystal plane oriented predominantly and not smaller than 20% of crystal orientation degrees in the Lotgering method.

* * * * *

UNITED STATES PATENT AND TRADEMARK OFFICE
CERTIFICATE OF CORRECTION

PATENT NO. : 6,093,338
DATED : July 25, 2000
INVENTOR(S) : Toshihiko Tani, et al.

It is certified that error appears in the above-identified patent and that said Letters Patent is hereby corrected as shown below:

Claim 9,
Line 2, delete "4" and insert -- 8 --.

Claim 14,
Line 2, delete "10 or 12" and insert -- 8 or 10 --.

Claim 15,
Line 2, delete "10 or 12" and insert -- 8 or 10 --.

Signed and Sealed this

Ninth Day of October, 2001

*Attest:*

NICHOLAS P. GODICI
*Attesting Officer*     *Acting Director of the United States Patent and Trademark Office*